US012463062B2

United States Patent
Imai et al.

(10) Patent No.: US 12,463,062 B2
(45) Date of Patent: Nov. 4, 2025

(54) SUBSTRATE PROCESSING APPARATUS, COMPUTER-READABLE STORAGE MEDIUM STORING A PROGRAM, AND SUBSTRATE PROCESSING METHOD

(71) Applicant: EBARA CORPORATION, Tokyo (JP)

(72) Inventors: Masayoshi Imai, Tokyo (JP); Mitsuru Miyazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 323 days.

(21) Appl. No.: 18/008,331

(22) PCT Filed: May 12, 2021

(86) PCT No.: PCT/JP2021/018096
§ 371 (c)(1),
(2) Date: Dec. 5, 2022

(87) PCT Pub. No.: WO2021/251050
PCT Pub. Date: Dec. 16, 2021

(65) Prior Publication Data
US 2023/0230857 A1    Jul. 20, 2023

(30) Foreign Application Priority Data
Jun. 9, 2020 (JP) ................. 2020-100421

(51) Int. Cl.
*H01L 21/67* (2006.01)
*H01L 21/02* (2006.01)
*H01L 21/687* (2006.01)

(52) U.S. Cl.
CPC .. *H01L 21/67034* (2013.01); *H01L 21/02057* (2013.01); *H01L 21/67051* (2013.01); *H01L 21/68785* (2013.01)

(58) Field of Classification Search
CPC ......... H01L 21/67034; H01L 21/02057; H01L 21/67051; H01L 21/68785
(Continued)

(56) References Cited

U.S. PATENT DOCUMENTS

2013/0233360 A1* 9/2013 Egashira ................. B08B 3/024
134/153
2016/0372320 A1* 12/2016 Emoto .............. H01L 21/67103
2018/0277399 A1* 9/2018 Hashimoto ....... H01L 21/67167

FOREIGN PATENT DOCUMENTS

| CN | 103311155 A | 9/2013 |
| CN | 103996639 A | 8/2014 |

(Continued)

OTHER PUBLICATIONS

International Patent Application No. PCT/JP2021/018096; Int'l Search Report; dated Aug. 3, 2021; 6 pages.

*Primary Examiner* — Tinsae B Ayalew
(74) *Attorney, Agent, or Firm* — BakerHostetler

(57) ABSTRACT

The present invention relates to a substrate processing apparatus for processing a substrate. The substrate processing apparatus (1) includes a controller (90). The controller (90) rotates the substrate (W) at a second speed, after rotating the substrate (W) at a first speed. The controller (90) supplies a dry fluid from a dry fluid nozzle (30) onto the substrate (W) for predetermined time after rotating the substrate (W) at the second speed, and while rotating the substrate (W) at a third speed. The controller (90) moves a dry fluid nozzle (30) from a center of the substrate (W) toward a peripheral portion of the substrate (W) while continuing to supply the dry fluid from the dry fluid nozzle (30).

17 Claims, 19 Drawing Sheets

(58) Field of Classification Search
USPC .......................................................... 134/198
See application file for complete search history.

(56)     References Cited

FOREIGN PATENT DOCUMENTS

| | | |
|---|---|---|
| CN | 107230653 A | 10/2017 |
| JP | 2002-110612 A | 4/2002 |
| JP | 2010-050436 A | 3/2010 |
| JP | 2014-078630 A | 5/2014 |
| JP | 2014-179525 A | 9/2014 |
| JP | 2017-005230 A | 1/2017 |
| JP | 2017-041509 A | 2/2017 |
| JP | 2017-175002 A | 9/2017 |
| JP | 2019-041509 A | 3/2019 |
| JP | 2020-021945 A | 2/2020 |
| TW | 201332005 A | 8/2013 |

\* cited by examiner

SUBSTRATE PROCESSING APPARATUS, COMPUTER-READABLE STORAGE MEDIUM STORING A PROGRAM, AND SUBSTRATE PROCESSING METHOD

TECHNICAL FIELD

The present invention relates to a substrate processing apparatus and a substrate processing method for processing a substrate. The present invention also relates to a computer-readable storage medium storing a program for executing such a substrate processing method.

BACKGROUND ART

Semiconductor devices are manufactured through a large number of processes by repeating film formation, patterning, etching, etc. of various circuits and electrode wiring. A multi-layered structure has been demanded along with high integration of the semiconductor devices, and flattening is required after forming a thin film layers constituting the multi-layered structure. A surface of the substrate is planarized by a chemical mechanical polishing process (CMP: Chemical Mechanical Polishing). The CMP planarizes the surface of the substrate by a chemical reaction of an abrasive liquid and a mechanical action of cutting the substrate with abrasive grains while the substrate is in sliding contact. A wafer is an example of such a substrate.

Residues such as polishing liquid containing abrasive grains and polishing dust remain on the polished substrate. For this reason, after polishing the substrate, the residue is removed from the substrate by chemical reaction with cleaning chemicals (mainly acids, alkalis, organic acids, etc.) and the physical action of brushes and jet nozzles, and then pure water is used to remove a foreign matter from the substrate. This has conventionally been used to clean the substrate. Examples of processing methods of the substrate after cleaning include spin dry drying in which pure water on the substrate after cleaning is shaken off by centrifugal force, and Rotagoni drying. In Rotagoni drying, a liquid flow of a cleaning rinse liquid is supplied from a rinse liquid nozzle to a rotating substrate to form a liquid film covering an entire substrate surface, and a drying gas containing IPA (isopropyl alcohol) vapor is supplied from the drying gas nozzle to an inside of the liquid flow, and a rinse solution nozzle and a drying gas nozzle are moved from a center of the rotating substrate to a periphery, thereby drying the entire substrate surface.

CITATION LIST

Patent Literature

Patent document 1: Japanese laid-open patent publication No. 2010-50436

SUMMARY OF INVENTION

Technical Problem

However, in recent years, with the increasing integration and density of the semiconductor devices, circuit wiring has become increasingly finer and wiring materials have changed. It has been required to remove even the adsorbed moisture (moisture adsorbed on the substrate), which has not been a problem with conventional drying methods. It is therefore an object of the present invention to provide a substrate processing apparatus with an improved removal rate of residual adsorbed moisture on the substrate, a substrate processing method, and a computer-readable storage medium storing a program for executing such a substrate processing method.

Solution to Problem

In an embodiment, there is provided a substrate processing method, comprising: forming a liquid film onto an entire surface of a substrate by rotating the substrate at a first speed to supply a liquid from a liquid nozzle positioned above a center of the substrate onto the substrate for a predetermined time; stopping a supply of the liquid, rotating the substrate at a second speed after rotating the substrate at the first speed; supplying a dry fluid from a dry fluid nozzle positioned above the center of the substrate onto the substrate for a predetermined time while rotating the substrate at a third speed after rotating the substrate at the second speed; and moving the dry fluid nozzle from the center of the substrate toward the peripheral portion of the substrate while continuing to supply the dry fluid from the dry fluid nozzle. According to this configuration, after the liquid film is once formed on the entire surface of the substrate, the step of rotating the substrate at the second speed is provided. After the center of the liquid film has been thinned or the liquid film has been removed to expose the surface of the substrate, the dry fluid is supplied to the substrate. As a result, residual adsorbed moisture on the substrate can be more reliably removed, providing the improved substrate processing method. The amount of dry fluid required for the liquid evaporation can be reduced, thereby reducing environmental impact and cost.

In an embodiment, the second speed is faster than the first speed. By making the second speed faster than the first speed and appropriate, the center of the liquid film can be thinned or the liquid film can be removed (exposing the substrate surface). Making the second speed faster than the first speed is also desirable from a throughput perspective.

In an embodiment, the method comprises: stopping a movement of the dry fluid nozzle when the dry fluid nozzle is positioned above the peripheral portion of the substrate; and supplying the dry fluid onto the peripheral portion of the substrate for predetermined time to dry the peripheral portion of the substrate. This configuration allows the periphery of the substrate to be dried more reliably, resulting in a more reliable drying of the entire surface of the substrate.

In an embodiment, the method comprises: stopping a supply of a dry fluid from a dry fluid nozzle after drying the peripheral portion of the substrate by the dry fluid supplied from the dry fluid nozzle positioned above the peripheral portion of the substrate; and moving the inert gas nozzle so that the inert gas nozzle is positioned above the center of the substrate to supply the inert gas from the inert gas nozzle onto the center of the substrate. According to this configuration, the inert gas is also supplied from above the substrate to dry the substrate more reliably and improve the drying quality of the substrate.

In an embodiment, the method comprises supplying the inert gas from the inert gas nozzle onto the substrate while moving the dry fluid nozzle and the inert gas nozzle from the center of the substrate toward the peripheral portion of the substrate. According to this configuration, the inert gas can be supplied to the surface of the substrate to promote evaporation of the liquid on the substrate.

In an embodiment, supplying the inert gas from the inert gas nozzle onto the substrate comprises injecting the inert gas behind the dry fluid injection position with respect to a direction of movement of the dry fluid nozzle and the inert gas nozzle. According to this configuration, after the dry fluid is supplied, the inert gas is supplied to the position where the drying fluid was supplied, further promoting evaporation of the liquid.

In an embodiment, the first speed comprises a liquid film formation speed for forming a liquid film on the substrate, and a thin film formation speed for thinning the center of the liquid film, the substrate processing method comprising rotating the substrate at the thin film formation speed for thinning the center of the liquid film after rotating the substrate at the liquid film formation speed, and the thin film formation speed is faster than the liquid film formation speed. According to this configuration, the liquid on the substrate can be moved outward in the radial direction of the substrate by centrifugal force, which enables smooth thinning of the center of the liquid film or removal of the liquid film when the substrate is rotated at the second speed.

In an embodiment, the dry fluid is a liquid organic solvent. By using the liquid organic solvent as the drying fluid, the liquid on the substrate can be efficiently evaporated together with the dry fluid.

In an embodiment, the dry fluid is a gas containing a gaseous organic solvent, and a content of the organic solvent in the dry fluid is 8% to 30%. By using such a dry fluid, the liquid on the substrate can be efficiently evaporated together with the drying fluid.

In an embodiment, the substrate is a substrate whose surface has been planarized by a chemical-mechanical polishing process, and the substrate has been submitted to process in a wet state. According to this configuration, the dry fluid can be supplied after the center of the liquid film is thinned or removed by swinging out the liquid film. As a result, even adsorbed moisture on the substrate can be removed without residual moisture while controlling the amount of drying fluid used.

In an embodiment, there is provided to a substrate processing apparatus for processing a substrate, comprising: a substrate holder configured to hold and rotate the substrate; a liquid supply mechanism configured to supply a liquid from a liquid nozzle onto the substrate; a dry fluid supply mechanism configured to supply a dry fluid from a dry fluid nozzle onto the substrate; a nozzle movement mechanism configured to move the liquid nozzle and the dry fluid nozzle; and a controller configured to control operations of the substrate holder, the liquid supply mechanism, and the dry fluid supply mechanism, the controller is configured to: issue a command to the substrate holder to rotate the substrate at a first speed; issue a command to the liquid supply mechanism to form a liquid film on an entire surface of the substrate by supplying the liquid from the liquid nozzle positioned above a center of the substrate onto the substrate for a predetermined time; issue a command to the liquid supply mechanism to stop a supply of the liquid; issue a command to the substrate holder, after rotating the substrate at the first speed, to rotate the substrate at a second speed; issue a command to the substrate holder, after rotating the substrate at the second speed, to rotate the substrate at a third speed, and issue a command to the dry fluid supply mechanism, while rotating the substrate at the third speed, to supply the dry fluid from the dry fluid nozzle positioned above the center of the substrate onto the substrate for a predetermined time; and issue a command to the nozzle movement mechanism while continuing to supply the dry fluid from the dry fluid nozzle to move the dry fluid nozzle from the center of the substrate toward a peripheral portion of the substrate. According to such a configuration, after the liquid film is once formed on the entire surface of the substrate, by providing the step of rotating the substrate at the second speed, the liquid film is thinned at the center or removed. After exposing the substrate surface, a dry fluid is applied to the substrate. As a result, residual adsorbed moisture on the substrate can be more reliably removed, and an improved substrate processing method can be provided. The amount of dry fluid required for evaporating the liquid can be reduced, thereby reducing the environmental burden and reducing costs.

In an embodiment, the second speed is faster than the first speed. By making the second speed faster than the first speed and appropriate, the center of the liquid film can be thinned or the liquid film can be removed (exposing the substrate surface). Making the second speed faster than the first speed is also desirable from a throughput perspective.

In an embodiment, the controller is configured to issue a command to the nozzle movement mechanism, when the dry fluid nozzle is arranged above the peripheral portion of the substrate, to dry the peripheral portion of the substrate by stopping a movement of the dry fluid nozzle for a predetermined time. This configuration allows the peripheral portion of the substrate to be dried more reliably, resulting in a more reliable drying of the entire surface of the substrate.

In an embodiment, the substrate processing apparatus further comprises an inert gas supply mechanism configured to supply an inert gas from an inert gas nozzle onto the substrate, the controller is configured to issue a command the nozzle movement mechanism, after drying the peripheral portion of the substrate by a dry fluid supplied from the dry fluid nozzle positioned above the peripheral portion of the substrate, to move the inert gas nozzle so that the inert gas nozzle is positioned above the center of the substrate, and the controller is configured to issue a command the inert gas supply mechanism to supply the inert gas from the inert gas nozzle onto the center of the substrate. According to this configuration, the inert gas is also supplied from above the substrate to dry the substrate more reliably and improve the drying quality of the substrate.

In an embodiment, the substrate processing apparatus further comprises an inert gas supply mechanism configured to supply an inert gas from an inert gas nozzle onto the substrate, the controller is configured to issue a command to the inert gas supply mechanism in a state in which the dry fluid is supplied onto the substrate, and the substrate is rotating at a fourth speed to supply the inert gas from the inert gas nozzle onto the substrate, and the controller is configured to issue a command to the nozzle movement mechanism to move the inert gas nozzle from the center of the substrate toward the peripheral portion of the substrate. According to this configuration, the inert gas can be supplied to the surface of the substrate to promote evaporation of the liquid on the substrate.

In an embodiment, the inert gas nozzle is arranged behind the dry fluid nozzle with respect to a direction of movement of the dry fluid nozzle and the inert gas nozzle. According to this configuration, after the dry fluid is supplied, the inert gas is supplied to the position where the dry fluid was supplied, further promoting evaporation of the liquid.

In an embodiment, the nozzle movement mechanism comprises one arm configured to hold the liquid nozzle, the dry fluid nozzle, and the inert gas nozzle. This configuration allows for a compact nozzle movement mechanism.

In an embodiment, the first speed comprises a liquid film formation speed for forming a liquid film on the substrate, and a thin film formation speed for thinning a center of the liquid film, the controller is configured to issue a command to the substrate holder after rotating the substrate at the liquid film formation speed to rotate the substrate at the thin film formation speed, and the thin film formation speed is faster than the liquid film formation speed. According to this configuration, the liquid on the substrate can be moved outward in the radial direction of the substrate by centrifugal force, which enables smooth thinning of the center of the liquid film or removal of the liquid film when the substrate is rotated at the second speed.

In an embodiment, the nozzle movement mechanism comprises a heater arranged adjacent to the dry fluid nozzle. This configuration allows the drying fluid injected from the drying fluid nozzle to be warmed. As a result, the evaporation time of organic solvents such as IPA can be accelerated.

In an embodiment, the dry fluid supply mechanism further comprises a conductive dry fluid supply line connected to the dry fluid nozzle. This configuration would prevent static electricity and prevent the explosion of dry fluid.

In an embodiment, the comprising: a ventilation mechanism arranged above the substrate holder; and an exhaust duct, the ventilation mechanism and the exhaust duct are configured to form a down flow of air. According to this configuration, the formation of such air down flow creates a well-ordered airflow on the surface and back of the substrate, preventing the adhesion of substrate contaminants due to turbulence in the airflow.

In an embodiment, the dry fluid is a liquid organic solvent. By using liquid organic solvents as the dry fluid, the liquid on the substrate can be efficiently evaporated together with the dry fluid.

In an embodiment, the dry fluid is a gas containing a gaseous organic solvent, and a content of the organic solvent in the dry fluid is 8% to 30%. By using such a dry fluid, the liquid on the substrate can be efficiently evaporated together with the dry fluid.

In an embodiment, the substrate processing apparatus comprises a cover arranged around the substrate held by the substrate holder, and the cover is configured to rotate in the same direction and at the same speed as the substrate.

In an embodiment, the substrate holder comprises a plurality of chucks configured to the peripheral portion of the substrate, and the cover is fixed to the chucks.

In an embodiment, the substrate processing apparatus comprises a cover rotation mechanism configured to rotate the cover, the cover rotation mechanism comprises: a cover motor; and a transmission device configured to transmit a rotational force of the cover motor to the cover.

In an embodiment, there is provided to a non-transitory computer-readable storage medium storing a program for use in a substrate processing apparatus for processing the substrate, the program operating on a computer, the program causes the computer to execute: a step of issuing a command to a substrate holder to rotate the substrate at a first speed, the step of issuing a command to a liquid supply mechanism to form a liquid film onto an entire surface of the substrate by supplying a liquid from a liquid nozzle positioned above a center of the substrate onto the substrate for a predetermined time; a step of issuing a command to the liquid supply mechanism to stop a supply of the liquid; a step of issuing a command to the substrate holder to rotate the substrate at a second speed after rotating the substrate at the first speed; a step of issuing a command to the substrate holder to rotate the substrate at a third speed after rotating the substrate at the second speed, the step of issuing a command to a dry fluid supply mechanism while rotating the substrate at the third speed to supply a dry fluid from a dry fluid nozzle onto the substrate for a predetermined time; a step of issuing a command to a nozzle movement mechanism while continuing to supply the dry fluid from the dry fluid nozzle to move the dry fluid nozzle from the center of the substrate toward a peripheral portion of the substrate. According to such a configuration, after the liquid film is once formed on the entire surface of the substrate, by providing the step of rotating the substrate at the second speed, the liquid film is thinned at the central portion or removed. After exposing the substrate surface, a drying fluid is applied to the substrate. As a result, residual adsorbed moisture on the substrate can be more reliably removed, and an improved substrate processing method can be provided. In addition, the amount of drying fluid required for evaporating the liquid can be reduced, thereby reducing the environmental burden and reducing costs.

In an embodiment, the second speed is faster than the first speed. By making the second speed faster than the first speed and appropriate, the center of the liquid film can be thinned or the liquid film can be removed (exposing the substrate surface). Making the second speed faster than the first speed is also desirable from a throughput perspective.

In an embodiment, the program further causes the computer to execute a step of issuing a command to the nozzle movement mechanism, when the dry fluid nozzle is positioned above the peripheral portion of the substrate, to dry the peripheral portion of the substrate by stopping a movement of the dry fluid nozzle for a predetermined time. This configuration allows the peripheral portion of the substrate to be dried more reliably, resulting in a more reliable drying of the entire surface of the substrate.

In an embodiment, the program causes the computer to execute a step of issuing a command to the nozzle movement mechanism, after drying the peripheral portion of the substrate by a dry fluid supplied from the dry fluid nozzle positioned above the peripheral portion of the substrate, to move the inert gas nozzle so that the inert gas nozzle is positioned above the center of the substrate, and a step of issuing a command to an inert gas supply mechanism to supply the inert gas from the inert gas nozzle onto the center of the substrate. According to this configuration, the inert gas is also supplied from above the substrate to dry the substrate more reliably and improve the drying quality of the substrate.

In an embodiment, the program causes the computer to execute a step of issuing a command to the inert gas supply mechanism in a state in which the dry fluid is supplied onto the substrate, and the substrate is rotating at a fourth speed to supply the inert gas from the inert gas nozzle onto a front surface of the substrate. According to this configuration, the inert gas can be supplied to the surface of the substrate to promote evaporation of the liquid on the substrate.

In an embodiment, the first speed comprises a liquid film formation speed for forming a liquid film on the substrate, and a thin film formation speed for thinning a center of the liquid film, the program further causes the computer to execute a step of issuing a command to the substrate holder after rotating the substrate at the liquid film formation speed to rotate the substrate at the thin film formation speed, and the thin film formation speed is faster than the liquid film formation speed. According to this configuration, the liquid on the substrate can be moved outward in the radial direction of the substrate by centrifugal force, which enables smooth thinning of the center of the liquid film or removal of the liquid film when the substrate is rotated at the second speed.

Advantageous Effects of Invention

According to the present invention, after a liquid film is once formed on the entire surface of the substrate, the substrate is rotated at the second speed, so that after thinning the center of the liquid film on the substrate or after removing the liquid film, a dry fluid is applied to the substrate. As a result, the substrate can be dried while suppressing the remaining adsorbed moisture on the substrate.

DESCRIPTION OF EMBODIMENTS

Figure 1:
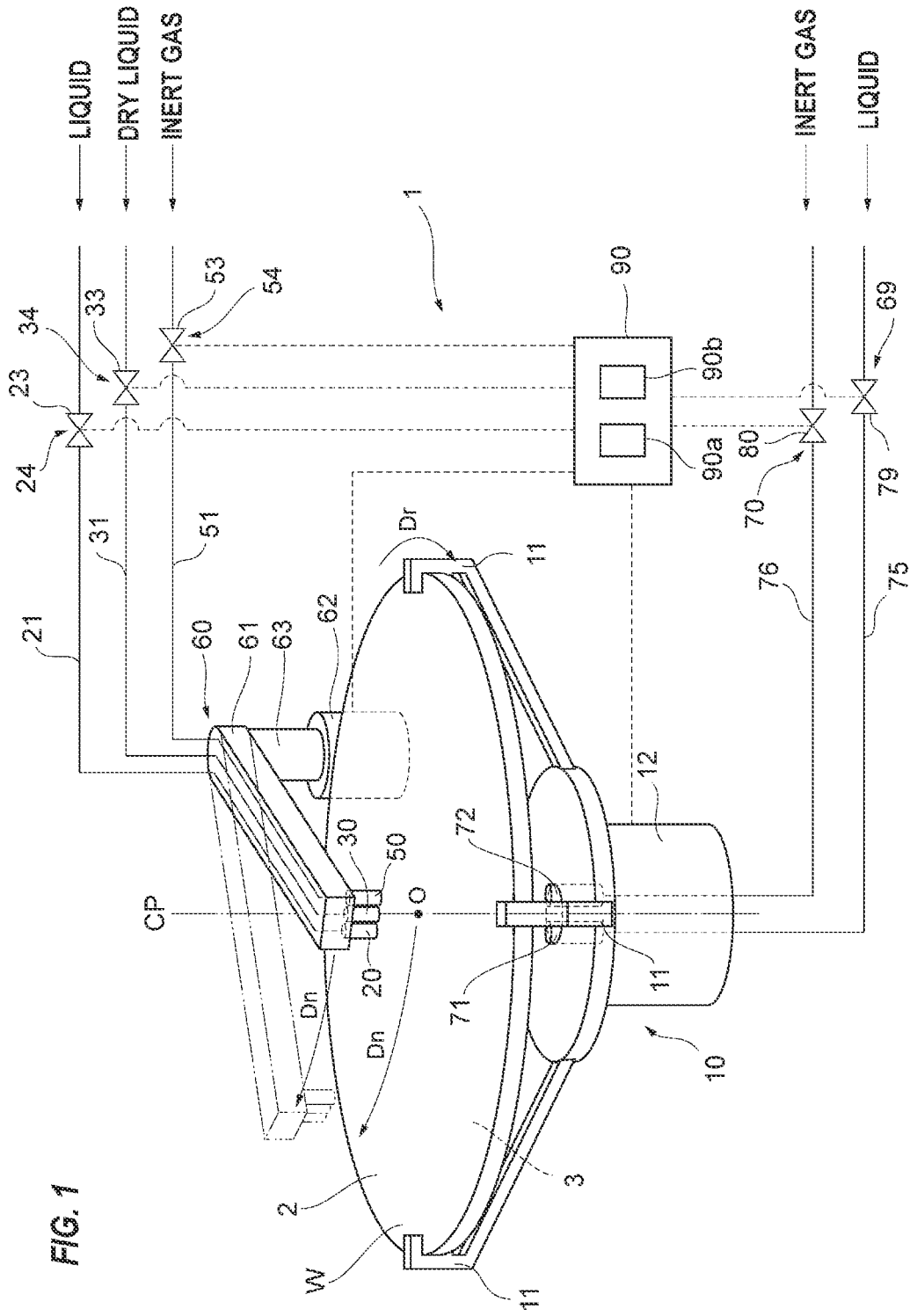
FIG. 1 is a schematic view showing a substrate processing apparatus.
Figure 2:
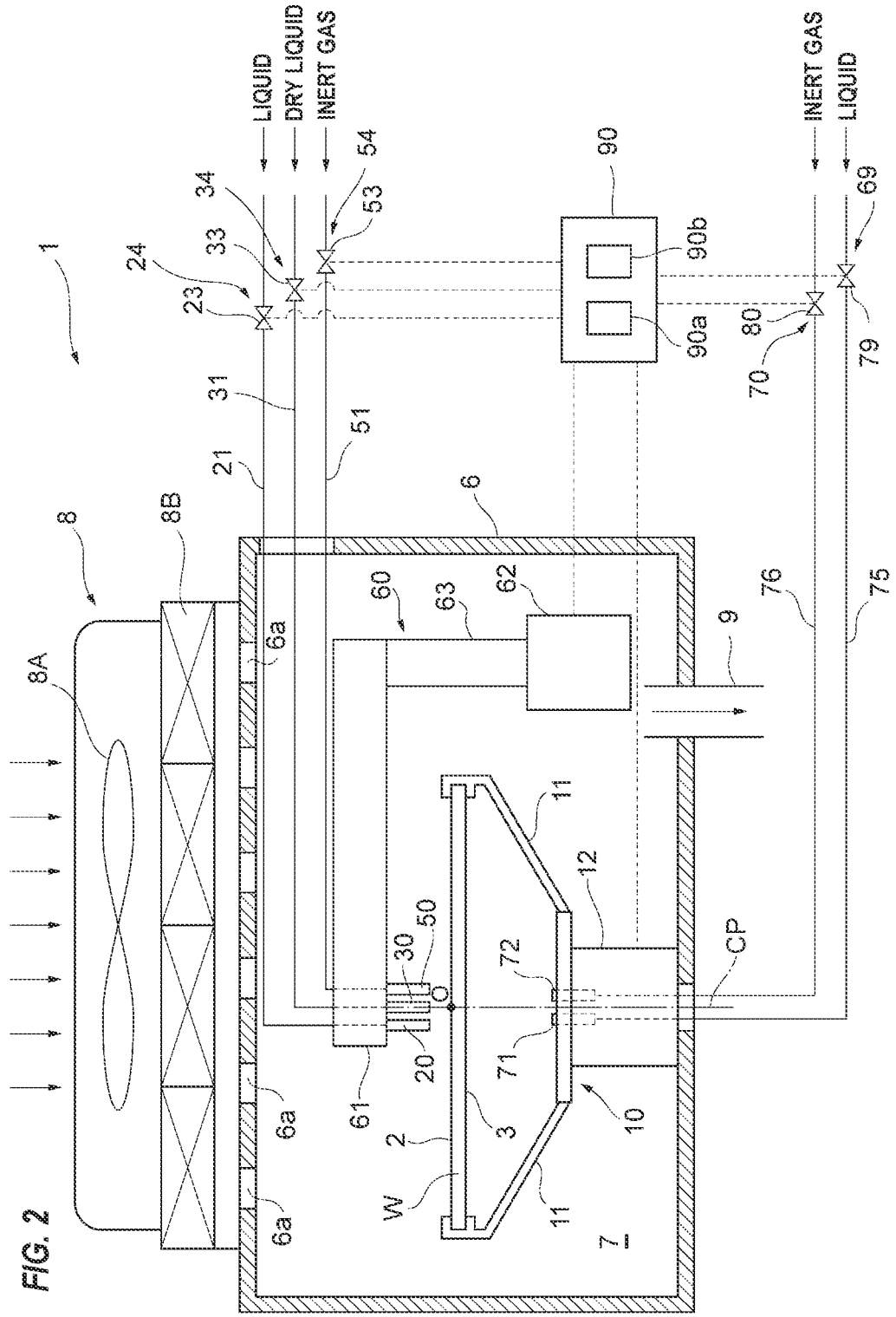
FIG. 2 is a side view of the substrate processing apparatus of FIG. 1.

Embodiments of the invention will be described below with reference to the drawings. FIG. 1 is a schematic view showing a substrate processing apparatus, and FIG. 2 is a side view of the substrate processing apparatus 1 of FIG. 1. In FIG. 1, a partition 6, a ventilator 8, and an exhaust duct 9 described below are omitted. The substrate processing apparatus 1 is an apparatus for processing a substrate. As shown in FIGS. 1 and 2, the substrate processing apparatus 1 includes a substrate holder 10 that holds and rotates the substrate W, a liquid supply mechanism 24 that supplies liquid to the substrate W, a dry fluid supply mechanism 34 that supplies a dry fluid to the substrate W, an inert gas supply mechanism 54 for supplying an inert gas to the substrate W, a first back-surface side supply mechanism 69 that supplies a liquid to the substrate W, and a second backside-side supply mechanism 70 that supplies the inert gas to the substrate W. The substrate W in this embodiment is a substrate after being polished by a chemical mechanical polishing process (CMP) and after being cleaned. Examples of cleaning methods include liquid cleaning (pure water, chemical solutions, etc.), mechanical cleaning (sliding with rolls, pencils, etc.), and even a combination of these liquid and mechanical cleaning methods. The substrate W has a front surface 2 that has been flattened.

As an example (a chemical mechanical polishing apparatus) of the substrate processing apparatus, the entire descriptions of US Patent Application Publication No. 2017/0252894 are hereby incorporated by reference into this application.

The liquid supply mechanism 24 includes a liquid nozzle 20 for supplying a liquid, a liquid supply line 21 for supplying the liquid to the liquid nozzle 20, and a liquid flow rate control valve 23 for adjusting a flow rate (the flow rate of the liquid supplied onto the substrate W) of the liquid flowing through the liquid supply line 21. The liquid supply mechanism 24 supplies the liquid onto the substrate W from the liquid nozzle 20.

The dry fluid supply mechanism 34 includes a dry fluid nozzle 30 for supplying a dry fluid, a dry fluid supply line 31 for supplying the dry fluid to the dry fluid nozzle 30, and a dry fluid flow rate control valve 33 for adjusting the flow rate (the flow rate of the dry fluid supplied onto the substrate W) of the dry fluid flowing through the dry fluid supply line 31. The dry fluid supply mechanism 34 supplies the dry fluid from the dry fluid nozzle 30 onto the substrate W.

The inert gas supply mechanism 54 includes an inert gas nozzle 50 for supplying the inert gas, an inert gas supply line 51 for supplying the inert gas to the inert gas nozzle 50, and an inert gas flow rate control valve 53 for adjusting a flow rate (the flow rate of the inert gas supplied onto the substrate W) of the inert gas flowing through the inert gas supply line 51. The inert gas supply mechanism 54 supplies the inert gas from the inert gas nozzle 50 onto the substrate W.

The first back-surface side supply mechanism 69 includes a first back-surface nozzle 71 for supplying a liquid, a first back-surface side supply line 75 for supplying the liquid to the first back-surface nozzle 71, and a first back-surface side flow rate control valve 79 for adjusting a flow rate (the flow rate of the liquid supplied onto the substrate W) of the liquid flowing through the first back-surface side supply line 75. The first back-surface side supply mechanism 69 supplies the liquid from the first back-surface nozzle 71 onto the substrate W.

The second back-surface side supply mechanism 70 includes a second back-surface nozzle 72 for supplying the inert gas, a second back-surface side supply line 76 for supplying the inert gas to the second back-surface nozzle 72, and a second back-surface side flow rate control valve 80 for adjusting a flow rate (the flow rate of the inert gas supplied to the substrate W) of the inert gas flowing through the second back-surface side supply line 76. The second back-surface side supply mechanism 70 supplies the inert gas from the second back-surface nozzle 72 onto the substrate W.

The substrate processing apparatus 1 includes a nozzle movement mechanism 60 for moving the liquid nozzle 20, the dry fluid nozzle 30, and the inert gas nozzle 50, and a controller 90 for controlling operations of the substrate holder 10, the liquid supply mechanism 24, the dry fluid supply mechanism 34, the inert gas supply mechanism 54, the first back-surface side supply mechanism 69, the second back-surface side supply mechanism 70, and the nozzle movement mechanism 60.

The liquid nozzle 20, the dry fluid nozzle 30, and the inert gas nozzle 50 (hereinafter, which are simply referred to as nozzles 20, 30, and 50) are arranged above the substrate W held by the substrate holder 10, and facing downwards (facing the front surface 2 of the substrate W). The back-surface nozzles 71 and 72 are arranged below the substrate W held by the substrate holder 10, and facing upward. In this embodiment, the back-surface nozzles 71 and 72 are arranged facing a center of the back surface 3 of the substrate W, but if a portion of the fluid (inert gas or liquid) hits the center of the back surface 3 of the substrate W, a shape of the nozzle may be a single tube, a fan shape, or a conical shape. In this embodiment, positions of the back-surface nozzles 71 and 72 are fixed. In one embodiment, the back-surface nozzles 71 and 72 may be configured to oscillate in a plane parallel to the substrate W (moveable in a radial direction of the substrate W) by a back-surface nozzle movement mechanism not shown. The liquid nozzle 20, the dry fluid nozzle 30, and the inert gas nozzle 50 supply the liquid, the dry fluid, and the inert gas, respectively, onto the front surface 2 of substrate W. The first back-surface nozzle 71 and the second back-surface nozzle 72 supply the liquid and the inert gas onto the back surface 3 of the substrate W, respectively.

Pure water is used as an example of the liquid supplied from the liquid nozzle 20 and the first back-surface nozzle 71. Liquid or gaseous organic solvents are used as examples of dry fluids. Examples of organic solvents include IPA (isopropyl alcohol) and fluorinated solvents containing alcohol. Organic solvents are defined herein to include both liquids and gases. When IPA is used as the organic solvent, a concentration of IPA in the organic solvent is preferably 100%, but depending on the substrate W processing conditions, the organic solvent may be an IPA mixed fluid. Nitrogen is used as an example of an inert gas.

The substrate holder 10 includes a plurality of chucks 11 for holding a peripheral portion of the substrate W, and a rotary motor 12 coupled to the plurality of chucks 11. The chucks 11 are configured to hold the substrate W horizontally. The rotary motor 12 is electrically connected to the controller 90, and an operation of the rotary motor 12 is controlled by the controller 90. The substrate W held by the chuck 11 is rotated around an axis CP of the substrate holder 10 by the rotary motor 12. In this embodiment, the substrate W rotates in a direction of an arrow Dr shown in FIG. 1. A rotation direction of the substrate W is not limited to this embodiment, and may rotate in an opposite direction of the arrow Dr. When the substrate W is held by the substrate holder 10, a center O of the substrate W and the axis CP coincide each other. FIGS. 1 and 2 show an example in which the substrate W is gripped by the chuck 11. As an example of the chuck 11, there is a chuck 11 configured so that an edge of the substrate W fits into a shallow groove of the chuck 11. If the chuck 11 is configured to support a side surface of the substrate W, configurations of the chuck 11 is not limited to this embodiment.

The nozzle movement mechanism 60 includes an arm 61 arranged above the substrate W held by the substrate holder 10, a swivel motor 62 as an arm rotation mechanism for swiveling the arm 61, and a swivel shaft 63 coupled to the swivel motor 62. The arm 61 has a length greater than a radius of the substrate W. The liquid nozzle 20, the dry fluid nozzle 30 and the inert gas nozzle 50 are attached to a tip of the arm 61. The nozzles 20, 30, and 50 are held by the arm 61. The swivel shaft 63 is connected to the other end of the arm 61.

The swivel motor 62 is electrically connected to the controller 90, and the operation of the swivel motor 62 is controlled by the controller 90. The swivel motor 62 swivels the arm 61 within the plane parallel to the substrate W by rotating the swivel shaft 63 by a predetermined angle. Therefore, the liquid nozzle 20, the dry fluid nozzle 30, and the inert gas nozzle 50 fixed to the arm 61 are moved in the radial direction of the substrate W by swiveling the arm 61. During processing of the substrate W, the nozzle movement mechanism 60 moves the nozzles 20, 30, and 50 together from the center of the substrate W toward the peripheral portion of the substrate W (outside in the radial direction of the substrate W, move in the direction of an arrow Dn as shown in FIG. 1).

In the embodiment shown in FIG. 1, the nozzles 20, 30, and 50 are held together by one arm 61, but in one embodiment, the nozzles 20, 30, and 50 may be held by the arms. In the embodiment shown in FIG. 3, the nozzle movement mechanism 60 includes a plurality of arms 61*a*, 61*b*, 61*c* (liquid nozzle holding arm 61*a*, dry fluid nozzle holding arm 61*b*, and inert gas nozzle holding arm 61*c*). The nozzles 20, 30 and 50 are held by arms 61*a*, 61*b* and 61*c*, respectively. The liquid nozzle 20 is attached to a tip of the liquid nozzle holding arm 61*a*, the dry fluid nozzle 30 is attached to a tip of the dry fluid nozzle holding arm 61*b*, and the inert gas nozzle 50 is attached to a tip of the inert gas nozzle holding arm 61*c*. Other ends of the arms 61*a*, 61*b* and 61*c* are connected to the swivel shaft 63. Configurations of the embodiment shown in FIG. 3, which is not particularly described, is the same as that of the embodiment shown in FIG. 1.

Figure 4:
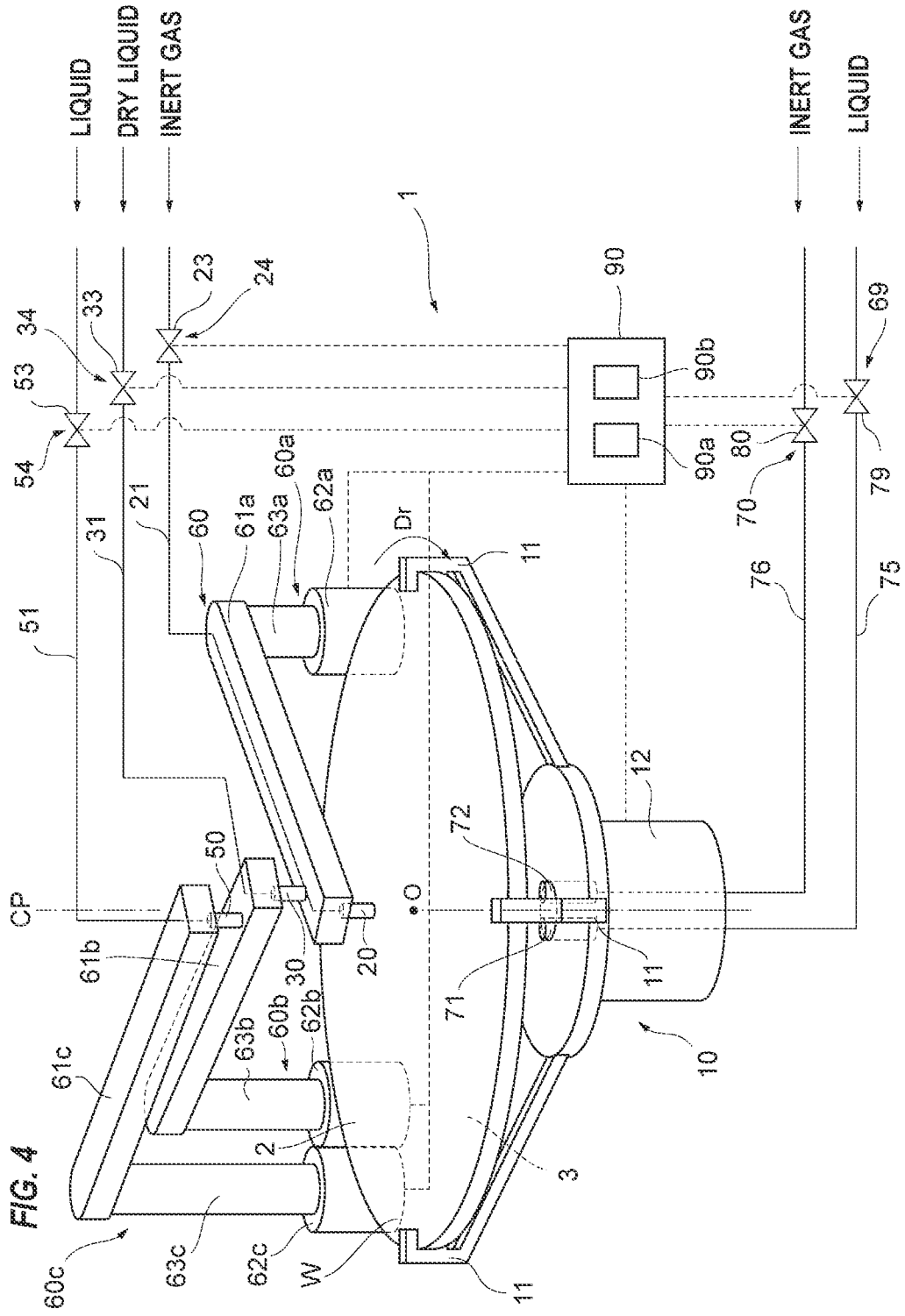
FIG. 4 is a schematic view showing another embodiment of the substrate processing apparatus in which a plurality of nozzles are held by a plurality of arms.

FIG. 4 is a schematic view showing another embodiment of the substrate processing apparatus 1 in which the nozzles 20, 30 and 50 are held by a plurality of arms. Configurations of the embodiment shown in FIG. 4, which is not particularly described, is the same as that of the embodiment shown in FIG. 1. In the embodiment shown in FIG. 4, the nozzle movement mechanism 60 includes a liquid nozzle movement mechanism 60*a* that moves the liquid nozzle 20, a dry fluid nozzle movement mechanism 60*b* that moves the dry fluid nozzle 30, and an inert gas nozzle movement mechanism 60*c* that moves the inert gas nozzle 50.

The liquid nozzle moving mechanism 60*a* includes a liquid nozzle holding arm 61*a*, a swivel motor 62*a* for swiveling the liquid nozzle holding arm 61*a*, and a swivel shaft 63*a* coupled to the swivel motor 62*a*. The dry fluid nozzle movement mechanism 60*b* includes a dry fluid nozzle holding arm 61*b*, a swivel motor 62*b* for swiveling the dry fluid nozzle holding arm 61*b*, and a swivel shaft 63*b* coupled to the swivel motor 62*b*. The inert gas nozzle movement mechanism 60*c* includes the inert gas nozzle holding arm 61*c*, a swivel motor 62*c* for swiveling the inert gas nozzle holding arm 61*c*, and a swivel shaft 63*c* coupled to the swivel motor 62*c*. The nozzles 20, 30 and 50 are held by the arms 61a, 61b and 61c, respectively. The liquid nozzle 20 is attached to the tip of the liquid nozzle holding arm 61a, the dry fluid nozzle 30 is attached to the tip of the dry fluid nozzle holding arm 61b, and the inert gas nozzle 50 is attached to the tip of the inert gas nozzle holding arm 61c. The other ends of the arms 61a, 61b and 61c are connected to the swivel shafts 63a, 63b and 63c, respectively.

The swivel motors 62a, 62b and 62c are electrically connected to the controller 90, and the controller 90 is configured to be able to independently control the operations of the swivel motors 62a, 62b and 62c. Each of the swivel motors 62a, 62b and 62c swivels each of the arms 61a, 61b and 61c within the plane parallel to the substrate W by rotating each of the swivel shafts 63a, 63b and 63c by a predetermined angle. The nozzles 20, 30 and 50 move in the radial direction of the substrate W by swiveling the arms 61a. 61b and 61c. The nozzle movement mechanism 60 of the present embodiment moves the nozzles 20, 30 and 50 independently in the radial direction of the substrate W during processing the substrate W.

Arrangements of the liquid nozzle movement mechanism 60a, the dry fluid nozzle movement mechanism 60b, and the inert gas nozzle movement mechanism 60c (hereinafter, which are simply referred to as the nozzle movement mechanisms 60a, 60b and 60c) is not limited to this embodiment. In one embodiment, the nozzle movement mechanisms 60b and 60c may be arranged near the liquid nozzle movement mechanism 60a, or the nozzle movement mechanisms 60a, 60b and 60c may be spaced from each other. In FIG. 4, the nozzles 20, 30 and 50 are arranged in order in a height direction so that the nozzles 20, 30 and 50 do not collide with each other. The arrangements of the nozzles 20, 30 and 50 in the height direction are not limited to the order shown in FIG. 4.

Returning to FIG. 1, one end of the liquid supply line 21 is connected to the liquid nozzle 20, and the other end is connected to a liquid supply source (not shown). One end of the dry fluid supply line 31 is connected to the dry fluid nozzle 30, and the other end is connected to a dry fluid supply source (not shown). One end of the inert gas supply line 51 is connected to the inert gas nozzle 50, and the other end is connected to an inert gas supply source (not shown).

The liquid is supplied from the liquid supply source through the liquid supply line 21 to the liquid nozzle 20, and from the liquid nozzle 20 onto the front surface 2 of the substrate W. The dry fluid is supplied from the dry fluid supply source to the dry fluid nozzle 30 through the dry fluid supply line 31, and from the dry fluid nozzle 30 to the front surface 2 of the substrate W. The inert gas is supplied from the inert gas supply source to the inert gas nozzle 50 through the inert gas supply line 51, and further supplied to the front surface 2 of the substrate W from the inert gas nozzle 50.

The liquid flow rate control valve 23 is attached to the liquid supply line 21, and the flow rate (the flow rate of the liquid supplied to the front surface 2 of the substrate W) of the liquid flowing through the liquid supply line 21 is adjusted by the liquid flow rate control valve 23. The dry fluid flow rate control valve 33 is attached to the dry fluid supply line 31, and the flow rate (the flow rate of the dry fluid supplied to the front surface 2 of the substrate W) of the dry fluid flowing through the dry fluid supply line 31 is controlled by the dry fluid flow rate control valve 33. The inert gas flow rate control valve 53 is attached to the inert gas supply line 51, and the flow rate (the flow rate of the inert gas supplied onto the front surface 2 of the substrate W) of the inert gas flowing through the inert gas supply line 51 is regulated by the inert gas flow rate control valve 53. The liquid flow rate control valve 23, the dry fluid flow rate control valve 33, and the inert gas flow rate control valve 53 are electrically connected to the controller 90. Operations of the liquid flow rate control valve 23, the dry fluid flow rate control valve 33, and the inert gas flow rate control valve 53 are controlled by the controller 90. The liquid flow rate control valve 23, the dry fluid flow rate control valve 33, and the inert gas flow rate control valve 53 can change the flow rates of the liquid, the dry fluid and the inert gas, respectively, during processing the substrate W.

The liquid flow rate control valve 23 is configured to open and close a flow path of the liquid of the liquid supply line 21, the dry fluid flow rate control valve 33 is configured to open and close a flow path of the dry fluid of the dry fluid supply line 31, and the inert gas flow rate control valve 53 is configured to open and close a flow path of the inert gas of the inert gas supply line 51. When the liquid flow rate control valve 23, the dry fluid flow rate control valve 33, and the inert gas flow rate control valve 53 are opened, the liquid, the dry fluid, and the inert gas are supplied to the liquid nozzle 20, the dry fluid nozzle 30, and the inert gas nozzle 50, respectively. When the liquid flow rate control valve 23, the dry fluid flow rate control valve 33, and the inert gas flow rate control valve 53 are closed, the supplies of the liquid, the dry fluid, and the inert gas are stopped.

One end of the first back-surface side supply line 75 is connected to the first back-surface nozzle 71, and the other end is connected to the liquid supply source (not shown). One end of the second back-surface side supply line 76 is connected to the second back-surface side nozzle 72, and the other end is connected to the inert gas supply source (not shown).

The liquid is supplied from the liquid supply source to the first back-surface nozzle 71 through the first back-surface side supply line 75, and further supplied from the first back-surface nozzle 71 onto the back surface 3 of the substrate W. The inert gas is supplied from the inert gas supply source to the second back-surface side nozzle 72 through the second back-surface side supply line 76, and further supplied from the second back-surface side nozzle 72 onto the back surface 3 of the substrate W.

A first back-surface side flow rate control valve 79 is attached to the first back-surface side supply line 75, and the flow rate (the flow rate of the liquid supplied onto the back surface 3 of the substrate W) of the liquid flowing through the first back-surface side supply line 75 is regulated by the first back-surface side flow control valve 79. A second back-surface side flow control valve 80 is attached to the second back-surface side supply line 76, and the flow rate (the flow rate of the inert gas supplied onto the back surface 3 of the substrate W) of the inert gas flowing through the second back-surface side supply line 76 is regulated by the second back-surface side flow control valve 80. The first back-surface side flow rate control valve 79 and the second back-surface side flow rate control valve 80 are electrically connected to the controller 90, and the operations of the first back-surface side flow rate control valve 79 and the second back-surface side flow rate control valve 80 are controlled by the controller 90. The first back-surface side flow rate control valve 79 and the second back-surface side flow rate control valve 80 can change the flow rates of the liquid and the inert gas during processing of the substrate W, respectively.

Further, the first back-surface side flow rate control valve 79 is configured to open and close the flow path of the liquid of the first back-surface side supply line 75, and the second back-surface side flow rate control valve 80 is configured to open and close the flow path of the inert gas of the second back-surface side supply line 76. When the first back-surface side flow rate control valve 79 and the second back-surface side flow rate control valve 80 are opened, the liquid and the inert gas are supplied to the first back-surface nozzle 71 and the second back-surface nozzle 72, respectively. When the first back-surface side flow rate control valve 79 and the second back-surface side flow rate control valve 80 are closed, the supplies of the liquid and the inert gas are stopped.

The controller 90 is composed of at least one computer. The controller 90 includes a storage device 90*a* in which programs are stored, and an arithmetic device 90*b* that executes calculations according to instructions included in the programs. The arithmetic device 90*b* includes a CPU (Central Processing Unit) or a GPU (Graphic Processing Unit) that performs calculations according to instructions included in a program stored in the storage device 90*a*. The storage device 90*a* includes a main storage device (e.g., random access memory) accessible by the arithmetic device 90*b*, and a secondary storage device (e.g., hard disk drive or solid state drive) for storing data and programs. Also, the program in the controller 90 includes a recipe for the substrate processing apparatus 1 to execute the method of processing the substrate W.

At least one computer may be a server or a plurality of servers. The controller 90 may be an edge server, a PLC (programmable logic controller), a cloud server connected to a communication network such as the Internet or a local area network, or a fog computing device (gateway, fog server, router, etc.) installed within the network. The controller 90 may be a plurality of servers connected by a communication network such as the Internet or a local area network. For example, the controller 90 may be a combination of an edge server and a cloud server.

As shown in FIG. 2, the substrate processing apparatus 1 includes a partition wall 6, and a ventilation mechanism 8 arranged above the substrate holder 10. An internal space of the partition wall 6 constitutes a processing chamber 7. The substrate holder 10, the nozzles 20, 30 and 50, the nozzle movement mechanism 60, and the back-surface nozzles 71 and 72 are arranged inside the processing chamber 7. The partition wall 6 includes a door (not shown) through which the substrate W can be carried into the processing chamber 7 and carried out from the processing chamber 7. A clean air intake port 6*a* is formed in an upper portion of the partition wall 6, and an exhaust duct 9 is formed in a lower portion of the partition wall 6. The ventilation mechanism 8 is installed on an upper surface of the partition wall 6. The ventilation mechanism 8 includes a fan 8A, and a filter 8B for removing particles and dust in air sent from the fan 8A. The ventilation mechanism 8 sends clean air into the processing chamber 7 through the clean air inlet port 6*a*, and exhausts gas in the processing chamber 7 through the exhaust duct 9. As a result, a down flow of clean air is formed in the processing chamber 7. By forming such a down flow of air, it is possible to generate uniform airflows on the front surface 2 and the back surface 3 of the substrate W, and prevent an adhesion of substrate contaminants due to turbulence of the airflows.

In one embodiment, the exhaust duct 9 may consist of a plurality of exhaust ports (not shown) formed below the partition wall 6. By configuring the exhaust duct 9 with a plurality of exhaust ports, a less turbulent downward flow (down flow) can be obtained. In one embodiment, the exhaust duct 9 may be formed across the lower portion of the partition wall 6.

In this embodiment, an organic solvent such as IPA (isopropyl alcohol) or a fluorinated solvent containing alcohol is used as the dry fluid. In the present embodiment, since the air down flow is formed by the ventilation mechanism 8 and the exhaust duct 9, it is possible to prevent the dry fluid supplied onto the substrate W from evaporating and redepositing on the substrate W, and the evaporation of the liquid on the substrate W, which will be described later, is promoted. If such an organic solvent is mixed with air, there is a possibility that an explosive mixed gas will be generated. Therefore, it is necessary to optimize the airflow in the processing chamber 7 and to exhaust it from the safety point of view. In the present embodiment, since the ventilation mechanism 8 and the exhaust duct 9 form the air down flow, an explosion can be prevented.

In one embodiment, part or all of the dry fluid supply line 31 may be constructed of an electrically conductive material to prevent the aforementioned explosion. By using the conductive material as a material of the dry fluid supply line 31, static electricity can be prevented and explosion of the dry fluid can be prevented. Further, in one embodiment, a conductive material may be used as part or all of the chuck 11 material. Additionally, in one embodiment, the dry fluid supply line 31 and/or the chuck 11 may be grounded to prevent charging of the dry fluid supply line 31 and/or the chuck 11. As a specific example of the conductive material used for the dry fluid supply line 31, a conductive resin tube (a tube whose surface is laminated with a conductive resin, or a tube material whose surface is coated with a resin material mixed with conductive resin particles (CNT) is used, etc.). A specific example of the conductive material used for the chuck 11 is conductive polyetheretherketone (conductive PEEK).

Figure 5:
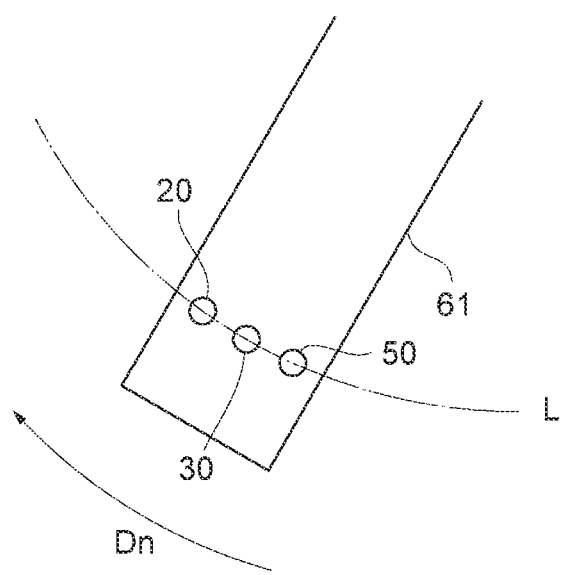
FIG. 5 is a top view for explaining arrangements of a liquid nozzle, a dry fluid nozzle, and an inert gas nozzle.

FIG. 5 is a top view for explaining an arrangement of the liquid nozzle 20, the dry fluid nozzle 30, and the inert gas nozzle 50. As shown in FIG. 5, the liquid nozzle 20, the dry fluid nozzle 30, and the inert gas nozzle 50 are arranged adjacent to each other. The inert gas nozzle 50 is arranged behind (upstream) the dry fluid nozzle 30 with respect to a movement direction Dn of the nozzles 20, 30 and 50. More specifically, the inert gas nozzle 50 is arranged so as to follow a trajectory drawn by the dry fluid nozzle 30 during movement. In other words, the inert gas nozzle 50 is arranged on an arc L whose radius is a straight line connecting the axis of the swivel shaft 63 (see FIG. 1) and the dry fluid nozzle 30. Therefore, the inert gas nozzle 50 traces the same trajectory as the dry fluid nozzle 30 and follows the dry fluid nozzle 30.

In this embodiment, the liquid nozzle 20 is arranged downstream (front) of the dry fluid nozzle 30 with respect to the movement direction Dn. In this embodiment, the liquid nozzle 20 is arranged on the arc L, but the arrangement of the liquid nozzle 20 is not limited to this embodiment. In one embodiment, the liquid nozzle 20 may be arranged off the arc L. The arrangements of the nozzles 20, 30 and 50 are not limited to this embodiment as long as the inert gas nozzle 50 is arranged so as to be able to move after the dry fluid nozzle 30. The liquid nozzle 20 and the inert gas nozzle 50 may be arranged at positions outside the arc L, but by arranging the dry fluid nozzle 30 and the inert gas nozzle 50 as in the embodiment shown in FIG. 5, the evaporation of the liquid on the substrate W (drying of the substrate W) is promoted. This is because w % ben the dry fluid nozzle 30 and the inert gas nozzle 50 are arranged as in the embodiment shown in FIG. 5, the inert gas nozzle 50 can trace the same trajectory as the dry fluid nozzle 30 and move behind the dry fluid nozzle 30 to inject the inert gas immediately behind a dry fluid injection position. Examples of the shapes of the nozzles 20, 30 and 50 include circular, fan-shaped, and elliptical shapes, but the shapes of the nozzles 20, 30 and 50 are not limited to these. Further, the nozzles 20, 30 and 50 are configured to be capable of injecting various forms of a fluid regardless of the form of the fluid to be injected (liquid, droplet, spray, etc.).

Figure 6:
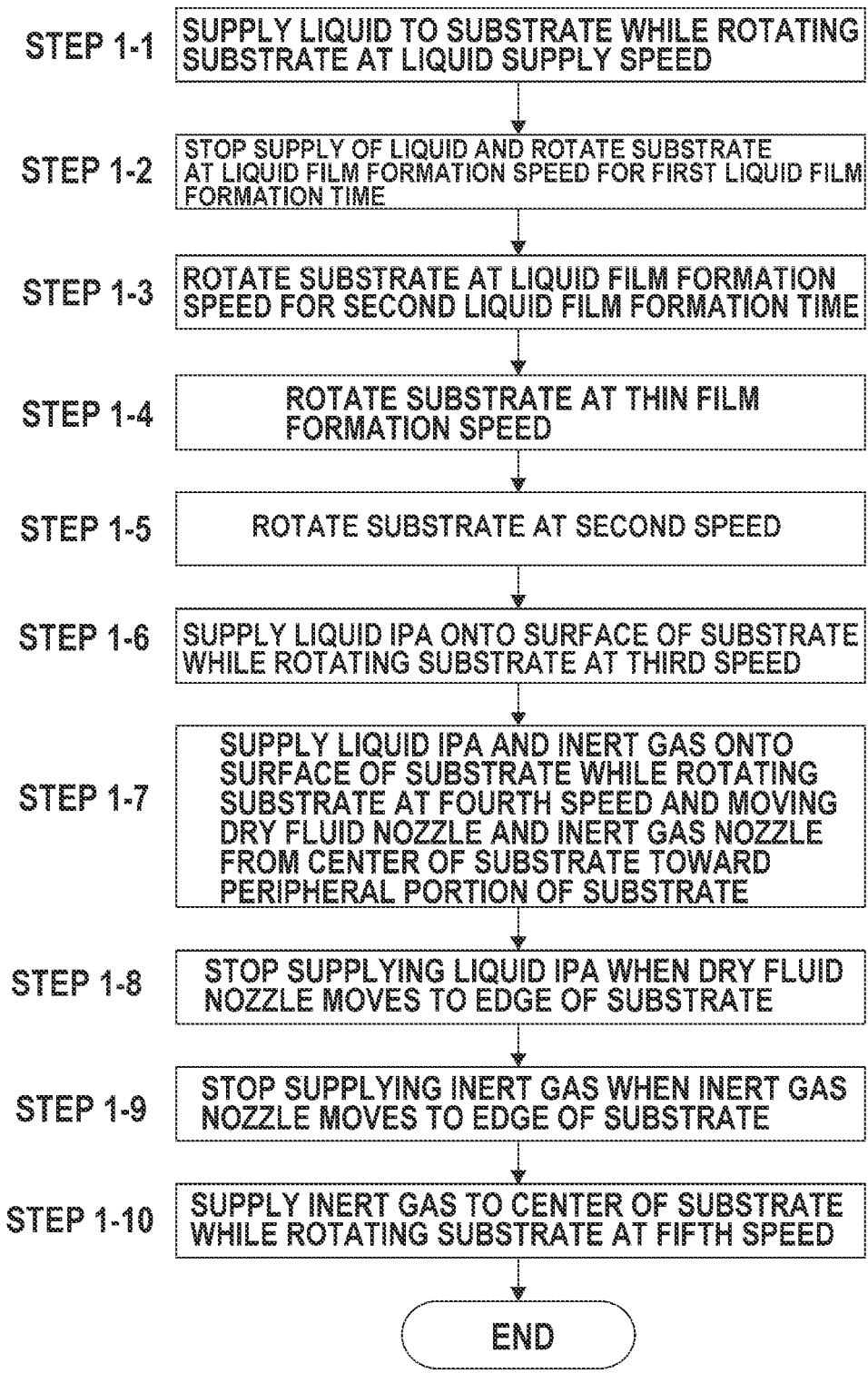
FIG. 6 is a flow chart showing an embodiment of a method for processing a substrate.

Next, a method for processing the substrate W will be described. FIG. 6 is a flow chart illustrating one embodiment of a method for processing the substrate W. FIGS. 7 to 17 are views showing a state of the substrate processing apparatus 1 in steps 1-1 to 1-10. In FIGS. 7 to 17, illustrations of the substrate holder 10, the swivel motor 62, the swivel shaft 63, and the controller 90 are omitted. In FIGS. 7 to 17, a valve drawn in white indicates an open state, and a valve drawn in black indicates a closed state. The following steps 1-1 to 1-10 are performed while supplying the inert gas from the second back-surface nozzle 72 to the back surface 3. By supplying the inert gas to the back surface 3 during processing of the substrate W, the substrate W can be processed while drying the back surface 3. In one embodiment of the processing method described below, the substrate processing apparatus 1 described with reference to FIGS. 1, 2 and 5 is used unless otherwise specified.

First, the substrate processing apparatus 1 rotates the substrate W at a first speed, and supplies the liquid onto the substrate W (the front surface 2 of the substrate W) from the liquid nozzle 20 positioned above the center of the substrate W for a predetermined time to form a film of the liquid (liquid film) on an entire surface of the substrate W (the entire front surface 2 of the substrate W) (steps 1-1 to 1-4). Specifically, the controller 90 issues a command to the rotary motor 12 of the substrate holder 10 to rotate the substrate W at the first speed. The controller 90 issues a command to the liquid flow rate control valve 23 of the liquid supply mechanism 24 to form the liquid film on the entire surface of the substrate W by supplying the liquid from the liquid nozzle 20 positioned above the center of the substrate W for a predetermined time.

Simplistically, a surface tension σ (at 20 degrees, σ=0.0728 N/m for water) exerts a force p (p=4σ/d, where d is a diameter of the liquid film) on the liquid film. The force p is a force that always tries to contract an inside of the liquid film as if it were covered with an elastic film. If a rotational speed of the substrate W becomes too high and a centrifugal force becomes larger than the surface tension σ, the liquid film may not be formed. Therefore, the rotational speed (the first speed above described) of the substrate W is preset so that the surface tension a is greater than the centrifugal force F (F=mω²r, where ω is an angular velocity proportional to the rotational speed of the substrate W) acting on the liquid film on the substrate W.

The controller 90 operates according to the instructions included in a program electrically stored in the storage device 90a That is, the controller 90 issues a command to the substrate holder 10 to rotate the substrate W at the first speed. The controller 90 issues a command to the liquid flow rate control valve 23 of the liquid supply mechanism 24 to execute a step of forming the liquid film on the entire surface of the substrate W by supplying the liquid from the liquid nozzle 20 positioned above the center of the substrate W for a predetermined period of time.

Figure 7:
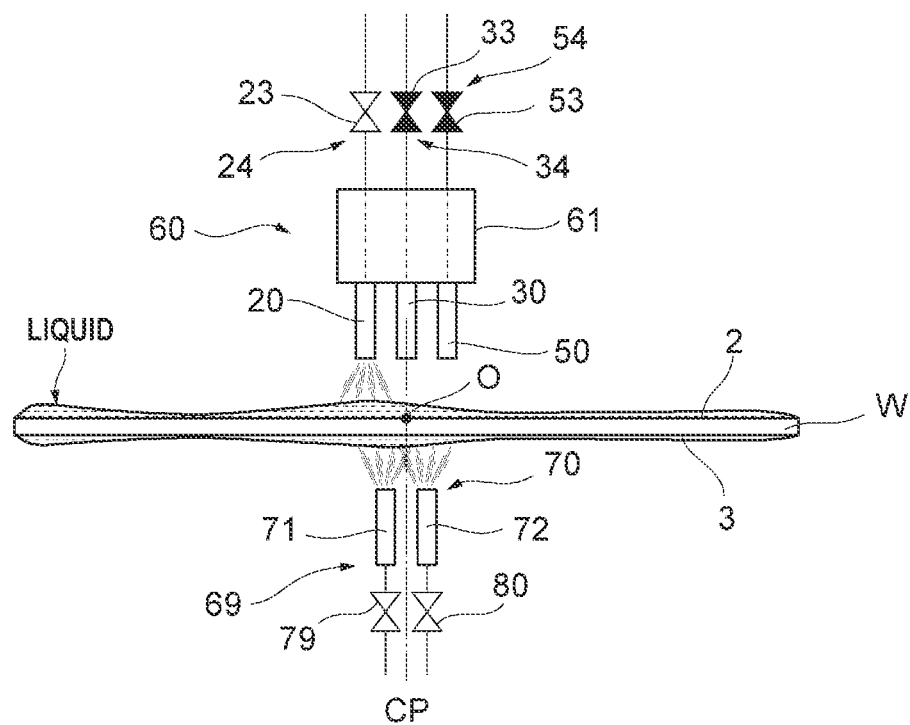
FIG. 7 is a view showing a state of the substrate processing apparatus.

Details of steps 1-1 to 1-4 are described below. The first speed is a speed including a liquid supply speed, a liquid film formation speed, and a thin film formation speed, which will be described later. First, the substrate processing apparatus 1 executes step 1-1. In step 1-1, as shown in FIG. 7, the substrate processing apparatus 1 holds the substrate W by the substrate holder 10 to supply the liquid onto each of the front surface 2 and the back surface 3 of the substrate W from the liquid nozzle 20 and the first back surface nozzle 71 positioned above the center of the substrate W for a predetermined time (liquid supply time) while rotating the substrate W at a predetermined liquid supply speed. The substrate processing apparatus 1 supplies the inert gas from the second back-surface nozzle 72 onto the back surface 3 of the substrate W while rotating the substrate W at the liquid supply speed. In this embodiment, pure water is used as the liquid and nitrogen is used as the inert gas.

In step 1-1, first, the controller 90 issues a command to the swivel motor 62 of the nozzle movement mechanism 60 to move the liquid nozzle 20 above the center of the substrate W. As a result, the arm 61 is positioned on the axis CP. The liquid nozzle 20 injects the liquid onto the center of the front surface 2 of the substrate W. The first back-surface nozzle 71 injects the liquid onto the center of the back surface 3 of the substrate W. The second back-surface nozzle 72 injects the inert gas onto the center of the back surface 3. Where, the liquid supply speed is a rotational speed of the substrate W when the liquid is supplied onto the substrate W in step 1-1. When using the embodiment shown in FIG. 4, the controller 90 issues a command to the swivel motor 62a of the nozzle movement mechanism 60 to move the liquid nozzle 20 above the center of the substrate W. As a result, the liquid nozzle holding arm 61a is positioned on the axis CP. When using the embodiment shown in FIG. 4, the dry fluid nozzle holding arm 61b and the inert gas nozzle holding arm 61c are located in a retracted position (outside the substrate holder 10).

The liquid supplied onto the center of the front surface 2 of the substrate W spreads over the entire surface 2 of the substrate W due to the centrifugal force. The liquid supplied onto the center of the back surface 3 of the substrate W spreads over the back surface 3 of the substrate W due to the centrifugal force. The inert gas supplied onto the center of the back surface 3 of the substrate W spreads over the entire back surface 3 of the substrate W due to the centrifugal force. In one embodiment, in a process of step 1-1, the liquid nozzle 20 may be positioned on the axial center CP (directly above a center O), and the liquid nozzle 20 may inject the liquid onto the center O of the substrate W.

By injecting the inert gas from the second back-surface nozzle 72, the liquid supplied from the liquid nozzle 20 and the first back-surface nozzle 71 can be prevented from flowing into the second back-surface nozzle 72. In one embodiment, the flow rate of the inert gas supplied onto the back surface 3 in step 1-1 is 5 L/min. In one embodiment, the flow rate of the inert gas supplied onto the back surface 3 of the substrate W is preset so as to always be smaller than the flow rate of the inert gas supplied onto the front surface 2 of the substrate W, which will be described later.

Specifically, the controller 90 issues a command to the rotary motor 12 of the substrate holder 10. The controller 90 issues a command to the liquid flow rate control valve 23 of the liquid supply mechanism 24 and the first back-surface side flow rate control valve 79 of the first back-surface side supply mechanism 69 while rotating the substrate W at the liquid supply speed. The controller 90 causes the liquid to be supplied to each of the front surface 2 and back surface 3 of the substrate W from the liquid nozzles 20 and the first back-surface nozzle 71, which are positioned above the center of the substrate W, during the liquid supply time. The controller 90 issues a command to the second back-surface side flow rate control valve 80 of the second back-surface side supply mechanism 70 while rotating the substrate W at the liquid supply speed to supply the inert gas from the second back-surface side nozzle 72 onto the back surface 3 of the substrate W.

The controller 90 operates according to instructions included in a program electrically stored in the storage device 90a. That is, the controller 90 issues a command to the rotary motor 12 of the substrate holder 10. The controller 90 issues a command to the liquid flow rate control valve 23 of the liquid supply mechanism 24 and the first back-surface side flow rate control valve 79 of the first back-surface side supply mechanism 69 while rotating the substrate W at the liquid supply speed. The controller 90 executes a step of supplying the liquid to the front surface 2 and the back surface 3 of the substrate W from the liquid nozzle 20 and the first back-surface nozzle 71 positioned above the center of the substrate W during the liquid supply time. The controller 90 issues a command to the second back-surface side flow rate control valve 80 of the second back-surface side supply mechanism 70, while rotating the substrate W at the liquid supply speed, to supply the inert gas from the second back-surface nozzle 72 onto the back surface 3 of the substrate W.

In one embodiment, the flow rate of the liquid supplied to the front surface 2 of substrate W is 0.8 L/min. The liquid supply speed at this time is 35 $min^{-1}$, 25 $min^{-1}$, or 20 $min^{-1}$. The liquid supply time is 3.75 seconds when the liquid supply flow rate is 0.8 L/min and the liquid supply speed is 35 $min^{-1}$. The liquid supply time is 7.5 seconds when the liquid supply flow rate is 0.8 L/min and the liquid supply speed is 25 $min^{-1}$. The liquid supply time is 11.25 seconds when the liquid supply flow rate is 0.8 L/min and the liquid supply speed is 20 $min^{-1}$.

Furthermore, in one embodiment, the flow rate of the liquid supplied to the front surface 2 of the substrate W is 1 L/min. The liquid supply speed at this time is 35 $min^{-1}$, 25 $min^{-1}$, or 20 $min^{-1}$. The liquid supply time is 3 seconds when the liquid supply flow rate is 1 L/min and the liquid supply speed is 35 $min^{-1}$. The liquid supply time is 6 seconds when the liquid supply flow rate is 1 L/min and the liquid supply speed is 25 $min^{-1}$. The liquid supply time is 9 seconds when the liquid supply flow rate is 1 L/min and the liquid supply speed is 20 $min^{-1}$.

Furthermore, in one embodiment, the flow rate of the liquid supplied to the front surface 2 of the substrate W is 2 L/min. The liquid supply speed at this time is 35 $min^{-1}$, 25 $min^{-1}$, or 20 $min^{-1}$. The liquid supply time is 1.5 seconds when the liquid supply flow rate is 2 L/min and the liquid supply speed is 35 $min^{-1}$. The liquid supply time is 3 seconds when the liquid supply flow rate is 2 L/min and the liquid supply speed is 25 $min^{-1}$. The liquid supply time is 4.5 seconds when the liquid supply flow rate is 2 L/min and the liquid supply speed is 20 $min^{-1}$.

Figure 8:
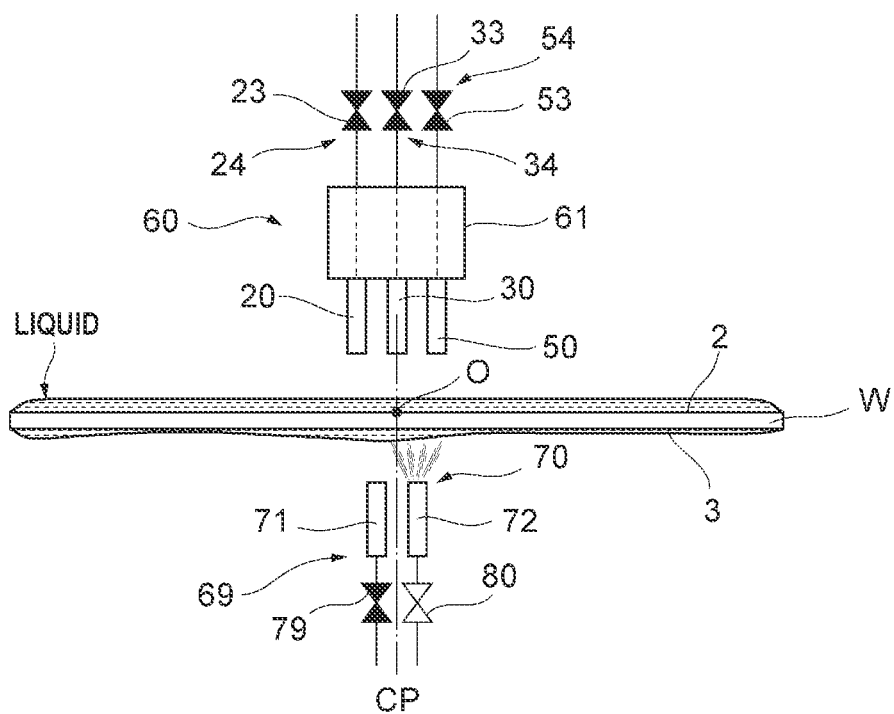
FIG. 8 is a view showing a state of the substrate processing apparatus.
Figure 9:
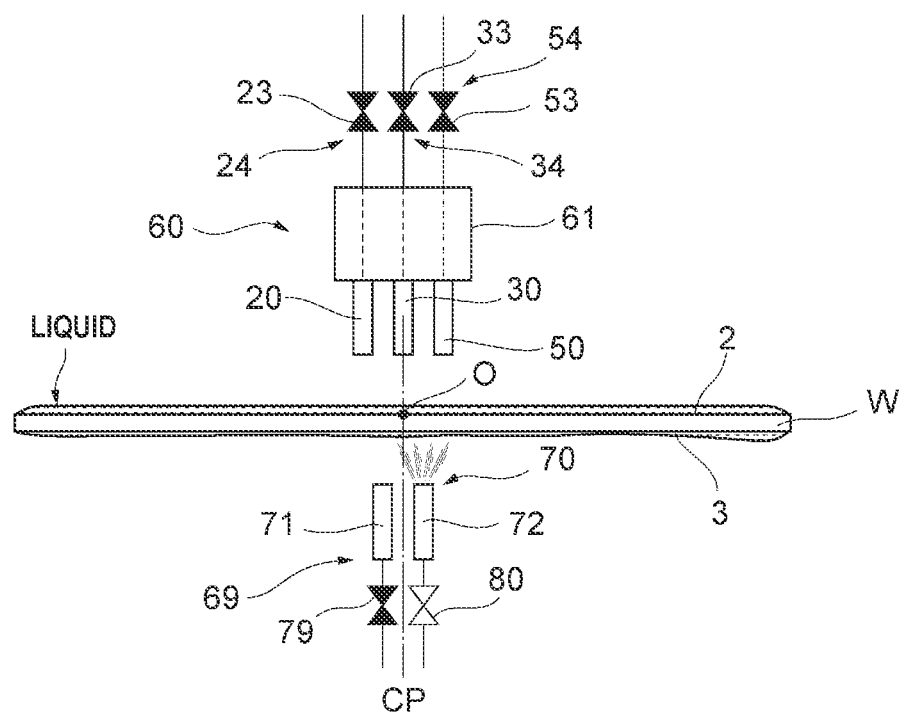
FIG. 9 is a view showing a state of the substrate processing apparatus.

In steps 1-2 and 1-3, as shown in FIGS. 8 and 9, the substrate processing apparatus 1 rotates the substrate W at a predetermined liquid film formation speed for a predetermined time (total liquid film formation time). In step 1-2, as shown in FIG. 8, the substrate processing apparatus 1 stops the supply the liquid from the liquid nozzle 20 and the first back-surface nozzle 71 while continuing to supply the inert gas from the second back-surface nozzle 72, and rotates the substrate W at a predetermined liquid film formation speed for a predetermined time (first liquid film formation time). Specifically, the controller 90 issues a command to the liquid flow rate control valve 23 and the first back-surface side flow rate control valve 79 while supplying the inert gas from the second back-surface nozzle 72 onto the back surface 3 to stop the supply of the liquid. The controller 90 issues a command to the rotary motor 12 of the substrate holder 10 to rotate the substrate W at the liquid film formation speed for the first liquid film formation time. Where, the liquid film formation speed is a rotational speed of the substrate W for forming the liquid film on the front surface 2 of the substrate W. The liquid film formation speed is the same as or slower than the liquid supply speed. In one embodiment, the liquid film formation speed is 20 $min^{-1}$, and the first liquid film formation time is 3 seconds. In one embodiment, the flow rate of the inert gas supplied onto the back surface 3 in step 1-2 is 5 L/min.

The controller 90 operates according to instructions included in a program electrically stored in the storage device 90a. That is, the controller 90 issues a command to the liquid flow rate control valve 23 and the first back-surface side flow rate control valve 79 to stop the supply of the liquid. The controller 90 issues a command to the rotary motor 12 to execute a step of rotating the substrate W at the liquid film formation speed for the first liquid film formation time. The above step is executed while the inert gas is being supplied to the back surface 3 from the second back-surface nozzle 72.

In the liquid film state of step 1-2, the centrifugal force acting on the liquid film on the front surface 2 of the substrate W is smaller than the surface tension acting between the liquid and the upper surface of the substrate, or the centrifugal force and the surface tension are almost antagonizing. As the rotational speed of the substrate W is reduced, the centrifugal force acting on the liquid on the substrate W is weakened, and an amount of the liquid discharged from the substrate W is reduced.

In step 1-3, as shown in FIG. 9, the substrate processing apparatus 1 continuously rotates the substrate W at the liquid film formation speed for a predetermined time (second liquid film formation time) while continuing to supply the inert gas from the second back-surface nozzle 72.

In one embodiment, the flow rate of the inert gas supplied onto the back surface 3 in step 1-3 is 5 L/min, and the second liquid film formation time is 2 seconds. The total liquid film formation time is the sum of the first liquid film formation time and the second liquid film formation time.

In step 1-3, in this embodiment, the substrate W is rotated at the same liquid film formation speed as in step 1-2 for the second liquid film formation time. In one embodiment, in step 1-3, the substrate W may be rotated at a slower speed (second liquid film formation speed) than the rotational speed (first liquid film formation speed) of the substrate W in step 1-2.

By performing step 1-1, the liquid (cleaning liquid such as pure water) adhering to the substrate after cleaning is mixed with the liquid supplied in step 1-1. Furthermore, in steps 1-1 to 1-3, a uniform liquid film containing the liquid adhering to the substrate after cleaning is formed on the front surface 2 of the substrate W (over the entire front surface 2 of the substrate W). By forming the liquid film on the substrate W, it is possible to prevent the formation of watermarks due to the liquid adhering to the substrate W after cleaning. Further, by rotating the substrate W at a relatively low speed as described in steps 1-2 and 1-3, an occurrence of the watermarks can be more reliably prevented.

Figure 10:
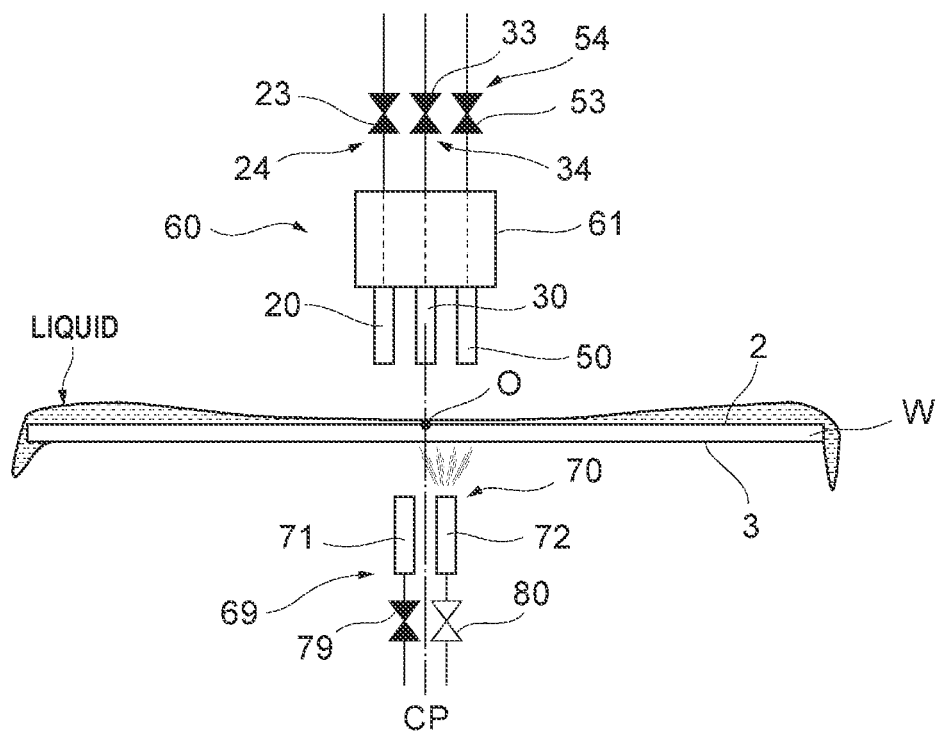
FIG. 10 is a view showing a state of the substrate processing apparatus.

In step 1-4, as shown in FIG. 10, the substrate processing apparatus 1 rotates the substrate W at a predetermined thin film formation speed for a predetermined time (thin film formation time) while continuing to supply the inert gas from the second back surface nozzle 72. Specifically, the controller 90 issues a command to the rotary motor 12 of the substrate holder 10 while continuing to supply the inert gas from the second back surface nozzle 72 to rotate the substrate W at the thin film formation speed for thin film formation time. Where, the thin film formation speed is a rotational speed of the substrate W for thinning a center of the liquid film on the front surface 2 of the substrate W. The thin film formation speed is a speed faster than the liquid film formation speed. Specifically, the thin film formation speed is 5 to 25 times faster than the liquid film formation speed. In one embodiment, the thin film formation speed is 100 $min^{-1}$, the thin film formation time is 2 seconds, and the inert gas supply flow rate in steps 1-4 is 5 L/min.

The controller 90 operates according to instructions included in a program electrically stored in the storage device 90a. That is, the controller 90 issues a command to the rotary motor 12 of the substrate holder 10 to execute a step of rotating the substrate W at the thin film formation speed for the thin film formation time. The above step is executed while the inert gas is being supplied from the second back-surface nozzle 72 to the back surface 3.

A thin film region formation step of step 1-4 is a step of forming a circular thin film region in which most of the liquid on the substrate W is removed and a very thin ultra-thin film (liquid thin film) remains in the center of the liquid film. A relatively strong centrifugal force acts on the liquid film on the substrate W, and the liquid existing in the center of the surface 2 of the substrate W is pushed away in the radial direction. There, a circular thin film region is formed in the center of the surface 2 of the substrate W.

By performing step 1-4, the substrate processing apparatus 1 gradually moves the liquid on the front surface 2 of the substrate W outward in the radial direction of the substrate W by the centrifugal force. As a result, the center of the liquid film on the front surface 2 becomes thinner, and a peripheral portion of the above film becomes thicker.

Figure 11:
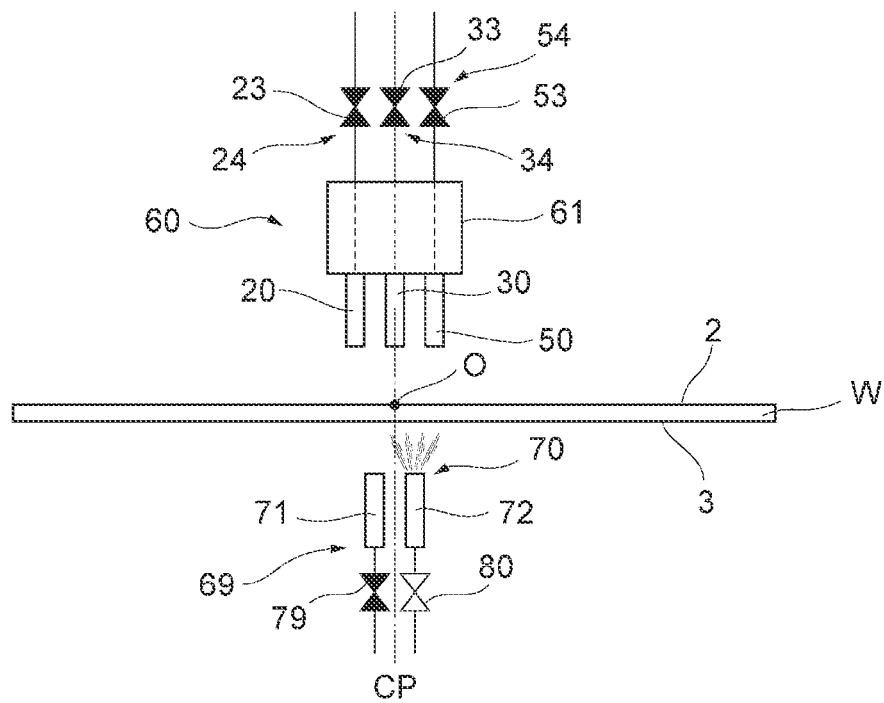
FIG. 11 is a view showing a state of the substrate processing apparatus.

In step 1-5, as shown in FIG. 11, the substrate processing apparatus 1 changes the inert gas supply flow rate, and rotates the substrate W at a predetermined second speed (swing-out speed) for a predetermined time (swing-out time). Specifically, the controller 90 issues a command to the second back-surface side flow control valve 80 to change the supply amount of the inert gas. The controller 90 issues a command to the rotary motor 12 of the substrate holder 10 while supplying the inert gas from the second back-surface nozzle 72 to the back surface 3 to rotate the substrate W at the second speed for the swing-out time. Where, the second speed is a rotational speed of the substrate W for swinging out the liquid film on the front surface 2 of the substrate W. The second speed is a speed that is faster than the first speed.

The controller 90 operates according to instructions included in a program electrically stored in the storage device 90a. That is, the controller 90 issues a command to the second back-surface side flow rate control valve 80 to execute a step of changing the supply amount of the inert gas, and issues a command to the rotary motor 12 of the substrate holder 10 to execute of rotating the substrate W at the second speed for the swing-out time. Each of the above steps is executed while the inert gas is being supplied to the back surface 3 from the second back surface nozzle 72.

In one embodiment, the second speed is 500 $min^{-1}$, the swing-out time is 1 second, and the inert gas supply flow rate in steps 1-5 is 2 L/min. In step 1-5, the liquid film on the front surface 2 of the substrate W is swung out by rotating the substrate W at the second speed. As a result, the liquid film on the front surface 2 is removed, and the front surface 2 of the substrate W is exposed.

Although step 1-5 removes the liquid film on the front surface 2, for example, when the substrate W has hydrophilic properties, a part of the liquid may remain (adsorb) on the front surface 2, the liquid on the front surface 2 is not completely removed. In the processes of the steps 1-6 to 1-9 below, the dry fluid is supplied onto the front surface 2 of the substrate W, and the dry fluid is mixed with the liquid remaining on the front surface 2 to evaporate the liquid together with the dry fluid. That is, the front surface 2 of the substrate W is dried.

Figure 12:
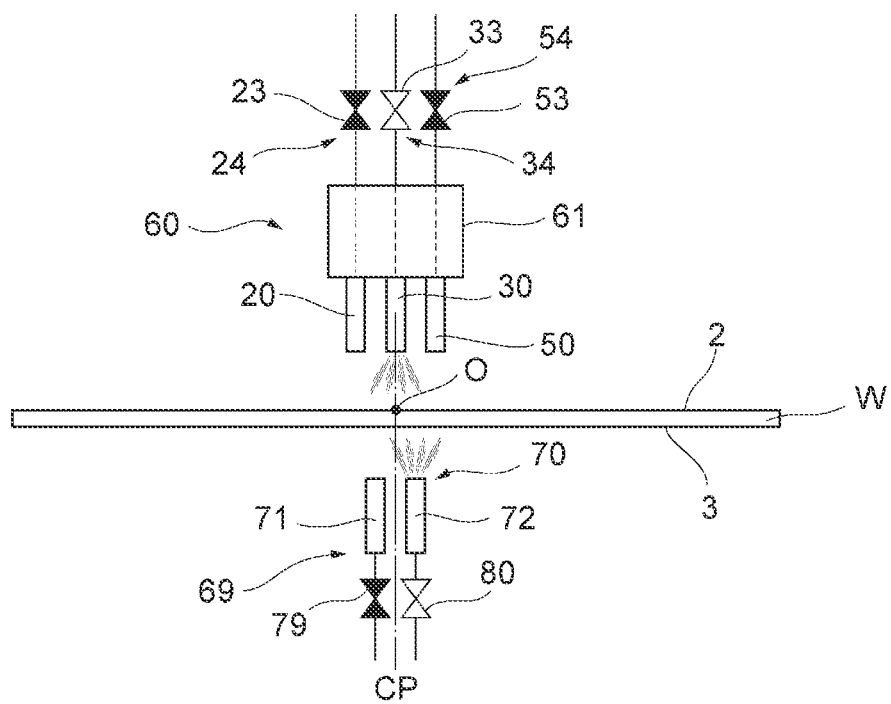
FIG. 12 is a view showing a state of the substrate processing apparatus.

In step 1-6, as shown in FIG. 12, the substrate processing apparatus 1 supplies a liquid IPA (which is referred to as liquid IPA) as the dry fluid from the dry fluid nozzle 30 onto the front surface 2 of the substrate W for a predetermined time (dry fluid supply time) while rotating the substrate W at a predetermined third speed (dry fluid supply speed). The substrate processing apparatus 1 changes the supply flow rate of the inert gas. In step 1-6, the arm 61 is positioned on the axis CP. Specifically, the dry fluid nozzle 30 is positioned above the center of the substrate W, and the dry fluid nozzle 30 injects the liquid IPA onto the center of the substrate W. In this embodiment, the dry fluid nozzle 30 is positioned on the axis CP, and the dry fluid nozzle 30 injects the liquid IPA onto the center O of the substrate W.

Figure 3:
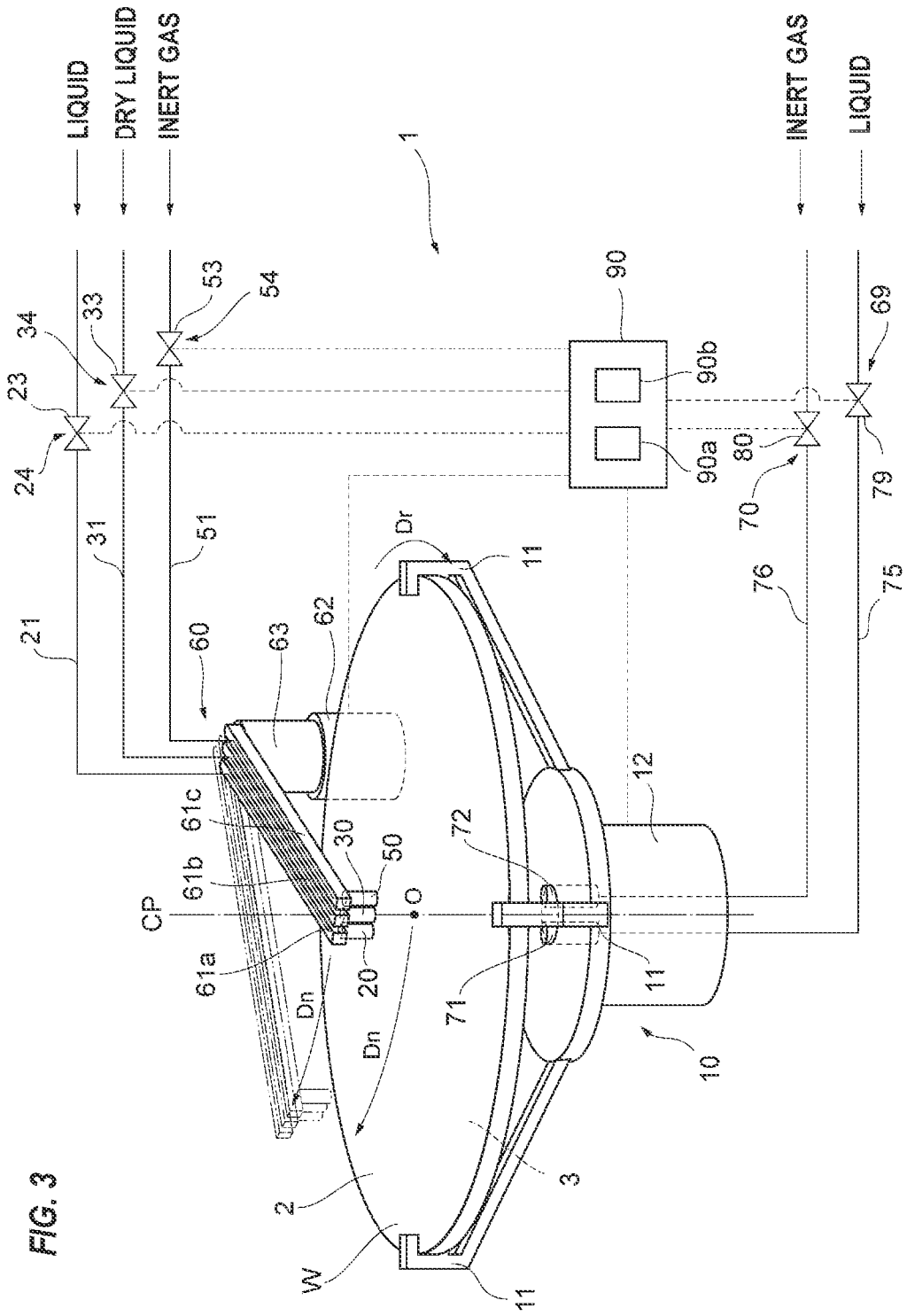
FIG. 3 is a schematic view showing an embodiment of a substrate processing apparatus in which a plurality of nozzles are held by a plurality of arms.

When using the embodiment shown in FIGS. 3 and 4, the dry fluid nozzle holding arm 61b is located on the axis CP. When using the embodiment shown in FIG. 4, the liquid nozzle holding arm 61a and the inert gas nozzle holding arm 61c are positioned at the retracted position (outside the substrate holder 10). When using the embodiment shown in FIG. 4, before step 1-6, the controller 90 issues a command to the swivel motor 62a to move the liquid nozzle 20 and the liquid nozzle holding arm 61a to the retracted position. The controller 90 issues a command to the swivel motor 62b to move the dry fluid nozzle 30 above the center (on the axis CP) of the substrate W. When using the embodiment shown in FIG. 4, the liquid nozzle 20 and the liquid nozzle holding arm 61a are positioned at the retracted position in the step 1-6 and subsequent steps.

In this embodiment, the liquid IPA is used as the dry fluid, but in one embodiment, a liquid organic solvent other than the liquid IPA may be used. The liquid organic solvent used as dry fluid has the property of being miscible with water and evaporating faster than water (e.g., ethyl alcohol, methyl alcohol, acetone, fluorine-based solvents).

More specifically, the controller 90 issues a command to the rotary motor 12 of the substrate holder 10 to rotate the substrate W at the third speed. While rotating the substrate W at the third speed, the controller 90 issues a command to the dry fluid flow rate control valve 33 to supply the liquid IPA from the dry fluid nozzle 30 positioned above the center of the substrate W onto the front surface 2 of the substrate W for the dry fluid supply time. Further, the controller 90 issues a command to the second back-surface side flow rate control valve 80 to change the supply amount of the inert gas. Where, the third speed is a rotational speed of the substrate W when supplying the dry fluid onto the substrate W in the step 1-6.

The controller 90 operates according to instructions included in a program electrically stored in the storage device 90a. That is, the controller 90 issues a command to the rotary motor 12 of the substrate holder 10 to rotate the substrate W at the third speed. While rotating the substrate W, the controller 90 issues a command to the dry fluid flow rate control valve 33 to execute a step of the liquid IPA from the dry fluid nozzle 30 positioned above the center of the substrate W onto the front surface 2 of the substrate W for the dry fluid supply time, and issues a command to the second back-surface side flow rate control valve 80 to execute a step of changing the supply amount of the inert gas. The above steps are executed while the inert gas is being supplied to the back surface 3 from the second back-surface nozzle 72.

In one embodiment, the third speed is 10 $\min^{-1}$, the flow rate of the liquid IPA supplied in the step 1-6 is 100 mL/min, the dry fluid supply time is 2 seconds, and the supply flow rate of the inert gas in the step 1-6 is 50 L/min.

Figure 13:
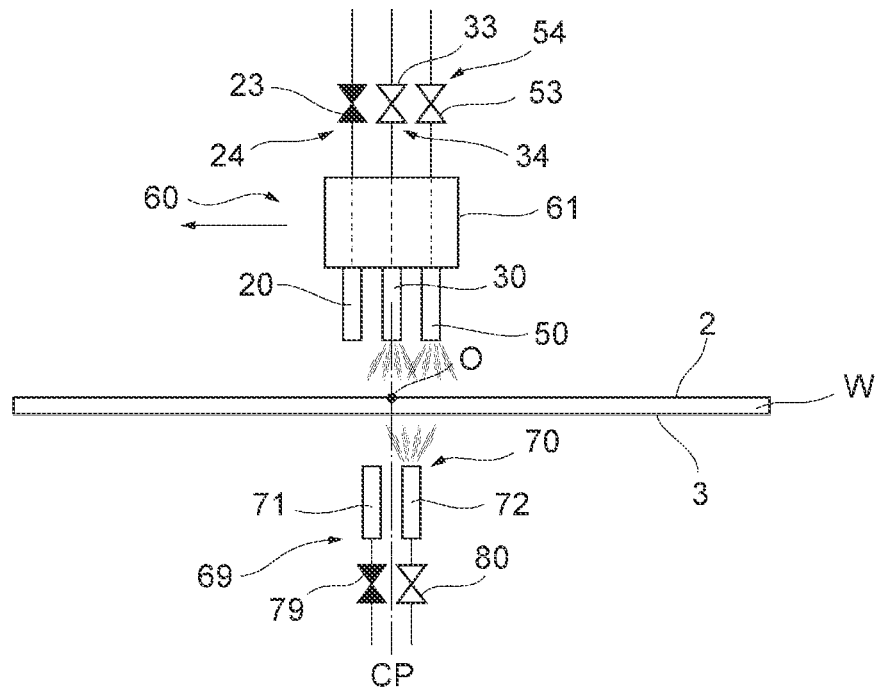
FIG. 13 is a view showing a state of the substrate processing apparatus.
Figure 14:
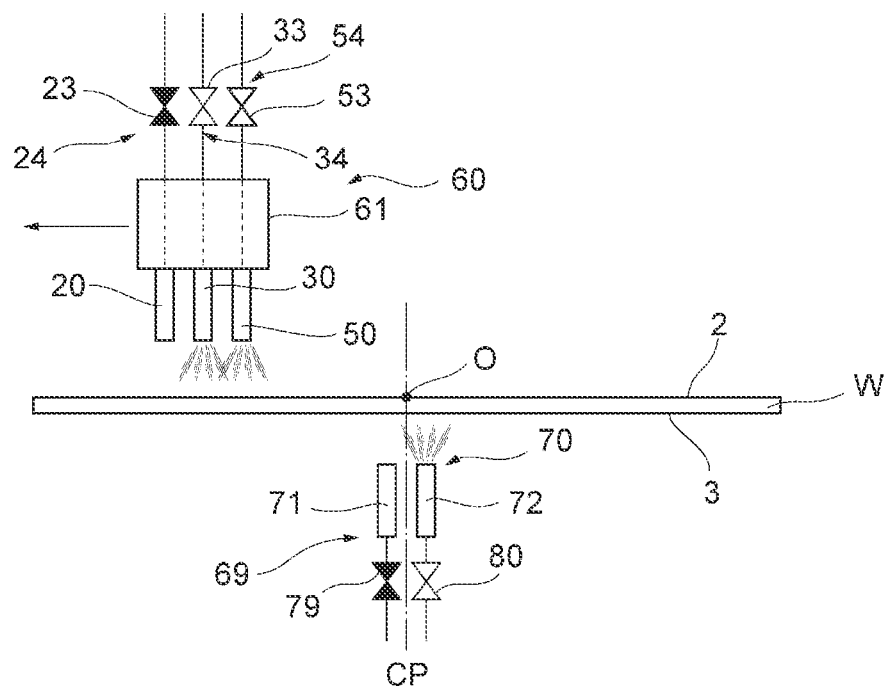
FIG. 14 is a view showing a state of the substrate processing apparatus.

In the step 1-7, as shown in FIGS. 13 and 14, the substrate processing apparatus 1 continues to supply the inert gas from the second back-surface nozzle 72 onto the back surface 3. In this state, the substrate processing apparatus 1 rotates the substrate W at a predetermined fourth speed while supplying the dry fluid from the dry fluid nozzle 30 onto the front surface 2 of the substrate W (i.e., while continuing to supply the dry fluid from the dry fluid nozzle 30). The substrate processing apparatus 1 moves the nozzles 20, 30 and 50 from the center of the substrate W (above the center O of the substrate W) toward the peripheral portion (above the peripheral portion of the substrate W) of the substrate W (moves the nozzles 20, 30 and 50 from the center of the substrate W radially outward of the substrate W). The substrate processing apparatus 1 starts the supply of the inert gas from the inert gas nozzle 50 at the same time when the nozzles 20, 30 and 50 start moving (see FIG. 13). In the step 1-7, the substrate processing apparatus 1 supplies each of the liquid IPA and the inert gas from each of the dry fluid nozzle 30 and the inert gas nozzle 50 onto the front surface 2 of the substrate W (see FIG. 14) while moving the nozzles 20, 30 and 50 from the center of the substrate W toward the peripheral portion of the substrate W.

When using the embodiment shown in FIG. 4, after the step 1-6, the controller 90 issues a command to the swivel motor 62c to move the inert gas nozzle 50 to a position adjacent to the dry fluid nozzle 30 and above the center of the substrate W. At this time, the swivel motor 62c moves the inert gas nozzle 50 upstream in the movement direction of the dry fluid nozzle 30 in the step 1-7. Processes in the case of using the embodiment shown in FIG. 4, which are not specifically described, are the same as those in the case of using the embodiment shown in FIG. 1. When using the embodiment shown in FIG. 4, the substrate processing apparatus 1 moves the nozzles 30 and 50 from the center of the substrate W toward the peripheral portion of the substrate W.

That is, the substrate processing apparatus 1 supplies the inert gas from the inert gas nozzle 50 onto the front surface 2 of the substrate W in a state in which the liquid IPA is supplied onto the front surface 2 of the substrate W, and the substrate W is rotating at the fourth speed. In one embodiment, the supply of the inert gas from the inert gas nozzle 50 may be started when the inert gas nozzle 50 is moved above the center O (e.g., on the axis CP). Where, the fourth speed is a rotational speed of the substrate W in the step 1-7, and the rotational speed of the substrate W for drying the substrate W. In this embodiment, nitrogen is used as the inert gas injected from the inert gas nozzle 50.

More specifically, the controller 90 issues a command to the rotary motor 12 of the substrate holder 10 to rotate the substrate W at the fourth speed w % bile continuously supplying the liquid IPA from the dry fluid nozzle 30 onto the front surface 2 of the substrate W in a state in which the inert gas is continuously supplied from the second back-surface nozzle 72 onto the back surface 3. Further, the controller 90 issues a command to the swivel motor 62 (when using the embodiment shown in FIG. 4, the swivel motors 62b and 62c) of the nozzle movement mechanism 60 while supplying the liquid IPA from the dry fluid nozzle 30 onto the front surface 2 of the substrate W and rotating the substrate W at the fourth speed to move (move the nozzles 20, 30 and 50 from the center of the substrate W radially outward of the substrate W) the nozzles 20, 30 and 50 (when using the embodiment shown in FIG. 4, the nozzles 30 and 50) from the center of the substrate W (above the center O of the substrate W) toward the peripheral portion of the substrate W (above the peripheral portion of the substrate W). Further, the controller 90 issues a command to the inert gas flow rate control valve 53 to supply the inert gas from the inert gas nozzle 50 onto the front surface 2 of the substrate W in a state in which the liquid IPA is supplied onto the front surface 2 of the substrate W. and the substrate W is rotated at the fourth speed. In other words, the controller 90 issues a command to the inert gas flow rate control valve 53 at the same time as the movement of the dry fluid nozzle 30 starts or when the inert gas nozzle 50 moves above the center O to start the supply of the inert gas from the inert gas nozzle 50 onto the front surface 2 of the substrate W.

The controller 90 operates according to instructions included in a program electrically stored in the storage device 90a. That is, the controller 90 issues a command to the rotary motor 12 of the substrate holder 10 to execute a step of rotating the substrate W at the fourth speed while supplying the liquid IPA from the dry fluid nozzle 30 onto the front surface 2 of the substrate W. The controller 90 issues a command to the swivel motor 62 (or swivel motors 62b and 62c) while supplying the liquid IPA from the dry fluid nozzle 30 onto the front surface 2 of the substrate W and rotating the substrate W at the four speed to execute of moving the nozzles 20, 30 and 50 (or nozzles 30 and 50) from the center of the substrate W toward the peripheral portion of the substrate W. The controller 90 issues a command to the inert gas flow rate control valve 53 in a state in which the liquid IPA is supplied onto the front surface 2 of the substrate W and the substrate W is rotated at the four speed to execute a step of supplying the inert gas from the inert gas nozzle 50 onto the front surface 2 of the substrate W (the step is referred to as an inert gas supply step). In one embodiment, the inert gas supply step includes a step of issuing a command to the inert gas flow rate control valve 53 at the same time that the dry fluid nozzle 30 begins to move, and starting the supply of the inert gas from the inert gas nozzle 50 onto the front surface 2 of the substrate W. Alternatively, the inert gas supply step includes a step of issuing a command to the inert gas flow rate control valve 53 when the inert gas nozzle 50 moves above the center O to start the supply the inert gas from the inert gas nozzle 50 onto the front surface 2. The above steps are executed in a state in which the inert gas is being supplied from the second back-surface nozzle 72 onto the back surface 3.

In one embodiment, the fourth speed is 500 min-, the flow rate of the liquid IPA supplied in the step 1-7 is 100 mL/min, and the time to perform the process of the step 1-7 (dry time) is 28.3 seconds or 30 seconds. The supply flow rate of the inert gas from the inert gas nozzle 50 in the step 1-7 is 150 L/min, and the supply flow rate of the inert gas from the second back-surface nozzle 72 is 50 L/min. Further, in one embodiment, the fourth speed may be gradually increased while performing the step 1-7 during the step 1-7. In one embodiment, the fourth speed may be increased from 10 $\min^{-1}$ to 1000 $\min^{-1}$ (rotational acceleration 35 rpm/s) during the step 1-7. In one embodiment, the inert gas supplied from the inert gas nozzle 50 is configured to supply more fluid per unit time than the dry fluid dispensed from the dry fluid nozzle 30.

In this embodiment, the substrate processing apparatus 1 moves the nozzles 20, 30 and 50 (or nozzles 30 and 50) once from the center of the substrate W (above the center O of the substrate W) onto the peripheral portion of the substrate W (above the peripheral portion of the substrate W) in the step 1-7. In one embodiment, the substrate processing apparatus 1 may move the nozzles 20, 30 and 50 (or nozzles 30 and 50) to the peripheral portion (above the peripheral portion) of the substrate, and then move the nozzles 20, 30 and 50 (or nozzles 30 and 50) above the center of the substrate W again. In one embodiment, the substrate processing apparatus 1 may reciprocate the nozzles 20, 30 and 50 (or the nozzles 30 and 50) between the center and the peripheral portion of the substrate W multiple times. An angular velocity of the arm 61 (or arms 61b and 61c), that is, movement velocities of the nozzles 20, 30 and 50 (or nozzles 30 and 50) are calculated from the permissible processing time and number of times.

In one embodiment, the substrate processing apparatus 1 may dry the peripheral portion of the substrate W by stopping the movement of the dry fluid nozzle 30 (when the dry fluid nozzle 30 is positioned above the peripheral portion of the substrate W, the dry fluid nozzle 30 stops moving, and the liquid IPA is supplied to the peripheral portion of the substrate W for the peripheral portion dry time) for a predetermined time (peripheral portion dry time) when the dry fluid nozzle 30 is positioned above the peripheral portion of the substrate W (e.g., the position where the outermost portion of the liquid IPA injected from the dry fluid nozzle 30 collides with the edge of the substrate W). Specifically, when the dry fluid nozzle 30 is positioned above the peripheral portion of the substrate W, the controller 90 may issue a command to the nozzle movement mechanism 60 to stop moving the dry fluid nozzle 30 for the peripheral portion dry time to dry the peripheral portion of the substrate W. The controller 90 operates according to instructions contained in a program electrically stored in the storage device 90a. That is, when the dry fluid nozzle 30 is positioned above the peripheral portion of the substrate W, the controller 90 may issue a command to the nozzle movement mechanism 60 to execute a step of stopping the movement of the dry fluid nozzle 30 for the peripheral portion dry time to dry the peripheral portion of the substrate. In one embodiment, the above peripheral portion dry time is from 1 to 10 seconds.

If none of the nozzles 20, 30 and 50 are present above the peripheral portion of the substrate W, airflow turbulence caused by the mixture of airflow hitting the edge of the substrate W and airflow not hitting the substrate W may cause droplets of liquid IPA, etc. to randomly scatter in the processing chamber 7, contaminating the substrate processing apparatus 1 (e.g., the inner wall of partition wall 6). However, since the dry fluid nozzle 30 is located above the peripheral portion of the substrate W, it is possible to more reliably prevent droplets of the liquid IPA from scattering, and to effectively prevent contamination of the substrate processing apparatus 1.

Figure 15:
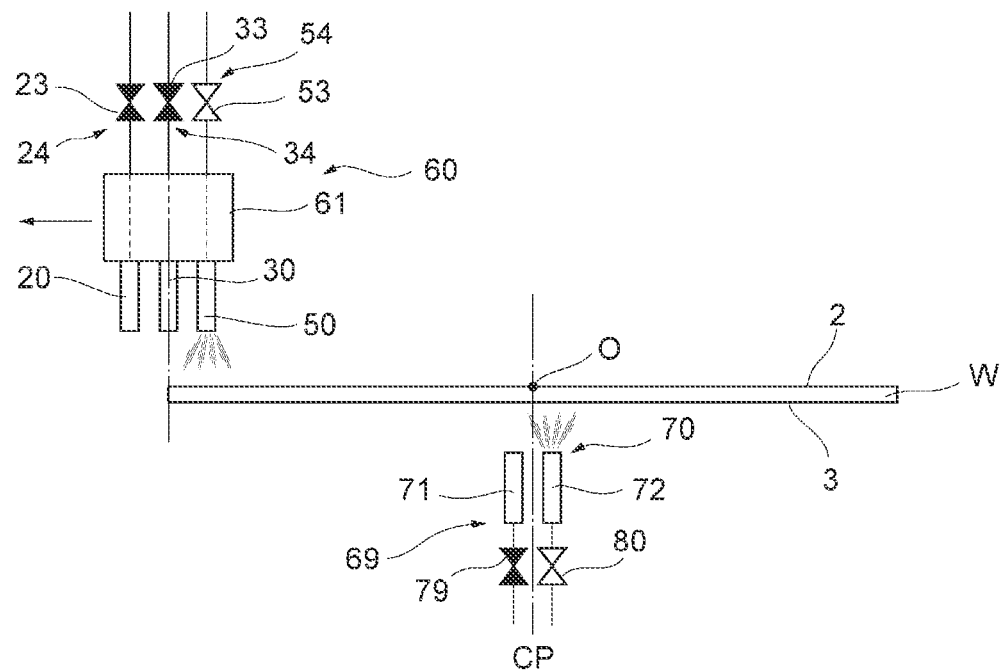
FIG. 15 is a view showing a state of the substrate processing apparatus.

In the step 1-8, the supply of the liquid IPA is stopped when the dry fluid nozzle 30 moves to the edge of the substrate W (directly above the edge of the substrate W) (see FIG. 15). Specifically, when the dry fluid nozzle 30 moves to the edge of the substrate W, the controller 90 issues a command to the dry fluid flow rate control valve 33 to stop the supply of the liquid IPA. The controller 90 operates according to instructions included in a program electrically stored in the storage device 90a. That is, when the dry fluid nozzle 30 moves to the edge of the substrate W, the controller 90 issues a command to the dry fluid flow rate control valve 33 to execute a step of stopping the supply of the liquid IPA. When drying the peripheral portion of the substrate W by stopping the movement of the drying fluid nozzle 30 for the peripheral portion dry time, the controller 90 issues a command to the dry fluid flow rate control valve 33 to stop the supply of the liquid IPA after the peripheral portion dry time has elapsed.

Figure 16:
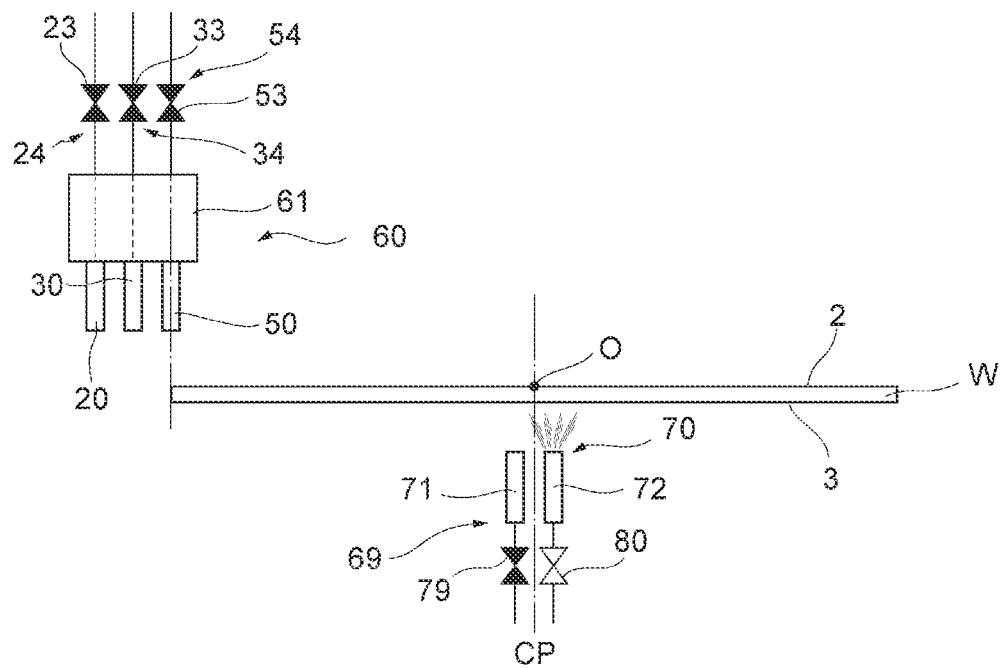
FIG. 16 is a view showing a state of the substrate processing apparatus.

In the step 1-9, when the inert gas nozzle 50 moves to the edge of the substrate W (directly above the edge of the substrate W), the supply of the inert gas is stopped (see FIG. 16). Specifically, when the inert gas nozzle 50 moves to the edge of the substrate W, the controller 90 issues a command to the inert gas flow rate control valve 53 to stop the supply of the inert gas. The controller 90 operates according to instructions included in a program electrically stored in the storage device 90a. That is, when the inert gas nozzle 50 moves to the edge of the substrate W, the controller 90 issues a command to the inert gas flow rate control valve 53 to execute a step of stopping the supply of the inert gas.

The steps 1-6 through 1-9 allow the liquid IPA to be supplied to the entire front surface 2 of the substrate W. Therefore, even the adsorbed moisture on the front surface 2 of the substrate W can be removed without any residue. As a result, the substrate can be dried without any liquid remaining on the front surface 2 of the substrate W.

The evaporation of the liquid (drying of the substrate W) can be accelerated by supplying the inert gas at the position where the liquid IPA is supplied. The inert gas nozzle 50 injects the inert gas behind the injection position of the drying fluid. In the embodiment described with reference to FIG. 5, the inert gas nozzle 50 is positioned adjacent to the dry fluid nozzle 30, and follows the dry fluid nozzle 30 on the same trajectory as the dry fluid nozzle 30. Therefore, by arranging the dry fluid nozzle 30 and the inert gas nozzle 50 as shown in FIG. 5, immediately after the liquid IPA is supplied, the inert gas is supplied to the position where the liquid IPA was supplied to further promote evaporation of the liquid (drying of the substrate W).

In this embodiment, the liquid IPA is supplied after removing the liquid film on the front surface 2 in the step 1-5. Therefore, the amount of the dry fluid required for evaporating the liquid can be reduced, and cost reduction can be achieved.

Figure 17:
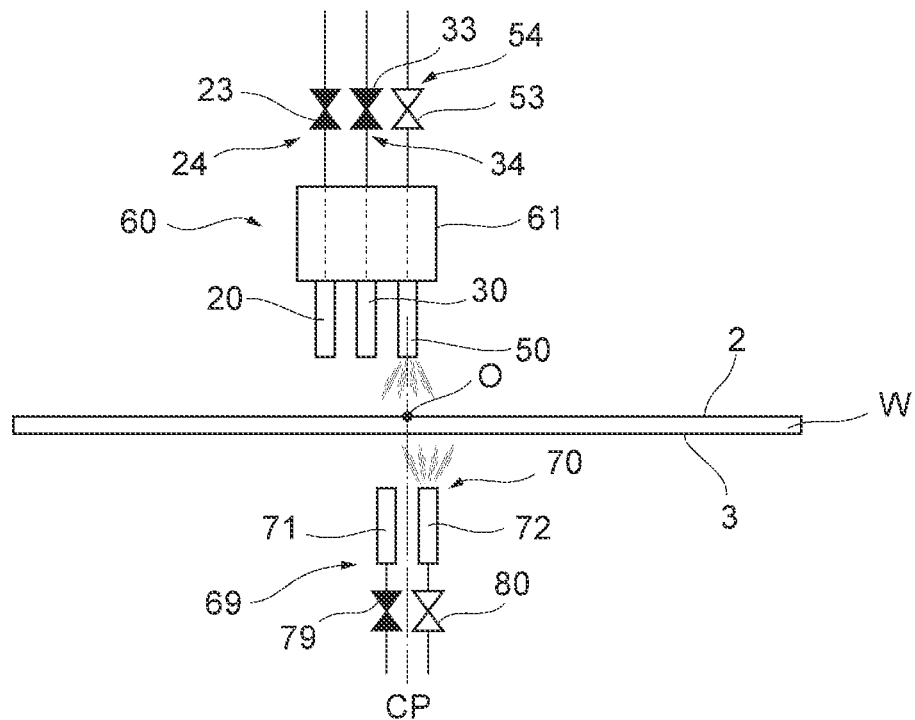
FIG. 17 is a view showing a state of the substrate processing apparatus.

In the step 1-10, as shown in FIG. 17, the substrate processing apparatus 1 moves the inert gas nozzle 50 above the center of the substrate W and rotates the substrate W at a predetermined fifth speed (finish drying speed) for a predetermined time (finish drying time) while the inert gas is continuously supplied to the back surface 3 from the second back-surface nozzle 72. As an example, the substrate processing apparatus 1 moves the inert gas nozzle 50 directly above the center O (on the axis center CP). Furthermore, the substrate processing apparatus 1 supplies the inert gas from the inert gas nozzle 50 onto the front surface 2 of the substrate W while rotating the substrate W at the fifth speed. Specifically, the inert gas nozzle 50 injects the inert gas to the center of the substrate W to supply the inert gas to the center of the substrate W. By the step 1-10, further promotes evaporation of the liquid and more reliably dries the substrate W.

Specifically, the controller 90 issues a command to the swivel motor 62 of the nozzle movement mechanism 60 (swivel motor 62c when using the embodiment in FIG. 4) to move the inert gas nozzle 50 above the center of the substrate W while continuously supplying the inert gas from the second back-surface nozzle 72 onto the back surface 3. The controller 90 issues a command to the rotary motor 12 of the substrate holder 10 to rotate the substrate W at the fifth speed. While rotating the substrate W at the fifth speed, the controller 90 issues a command to the inert gas flow rate control valve 53 of the inert gas supply mechanism 54 to supply the inert gas from the inert gas nozzle 50 onto the inert gas to the center of the substrate W. When using the embodiment shown in FIG. 4, the controller 90 issues a command to the swivel motor 62b to move the dry fluid nozzle holding arm 61b and the dry fluid nozzle 30 to the above retracted position before or while moving the inert gas nozzle 50 above the center of the substrate W.

The controller 90 operates according to instructions contained in a program electrically stored in the storage device 90a. That is, the controller 90 issues a command to the swivel motor 62 (or swivel motor 62c) of the nozzle movement mechanism 60 to execute a step of moving the inert gas nozzle 50 above the center of the substrate W. The controller 90 issues a command to the rotary motor 12 to execute a step of rotating the substrate W at the fifth speed. The controller 90 issues a command to the inert gas flow rate control valve 53 while rotating the substrate W at the fifth speed to execute a step of supplying the inert gas from the inert gas nozzle 50 onto the center of the substrate W. The above steps are performed with the inert gas being supplied to the back surface 3 from the second back-surface nozzle 72.

In one embodiment, the fifth speed is 1800 min$^{-1}$, the flow rate of the inert gas supplied from the inert gas nozzle 50 in the step 1-10 is 150 L/min. The flow rate of the inert gas supplied from the second back-surface nozzle 72 is 50 L/min. The finish drying time is 10 seconds. The controller 90 issues a command to the inert gas flow rate control valve 53 and the second back-surface nozzle 72 after the finishing drying time has elapsed to stop the supply of the inert gas. Furthermore, the controller 90 issues a command to the rotary motor 12 to stop the rotation of the substrate W. This completes the drying of the substrate.

Figure 18:
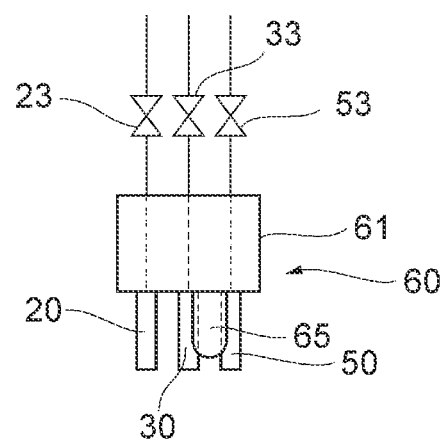
FIG. 18 is a schematic view showing another embodiment of a nozzle movement mechanism.

In one embodiment, as shown in FIG. 18, the nozzle movement mechanism 60 may further include a heater 65 for warming the dry fluid. In the embodiment shown in FIG. 18, the heater 65 is arranged adjacent to the dry fluid nozzle 30.

By heating the dry fluid nozzle 30 with the heater 65, the dry fluid injected from the dry fluid nozzle 30 can be warmed.

Thereby, the evaporation time of the organic solvent such as IPA can be shortened. In one embodiment, the organic solvent may be directly warmed by a heating device (not shown).

Furthermore, in one embodiment, the substrate W may be warmed. In one embodiment, the substrate holder 10 may include the heater 65 to heat the substrate W. The heater 65 may be arranged below the substrate W. Furthermore, in one embodiment, the second back-surface side supply line 76 may be connected to a hot water supply source (not shown) instead of the inert gas supply source. The substrate processing apparatus 1 may be configured to supply the hot water to the back surface 3 instead of the inert gas from the second back-surface nozzle 72. Warming the substrate W also speeds up the drying time of the organic solvent.

Figure 19:
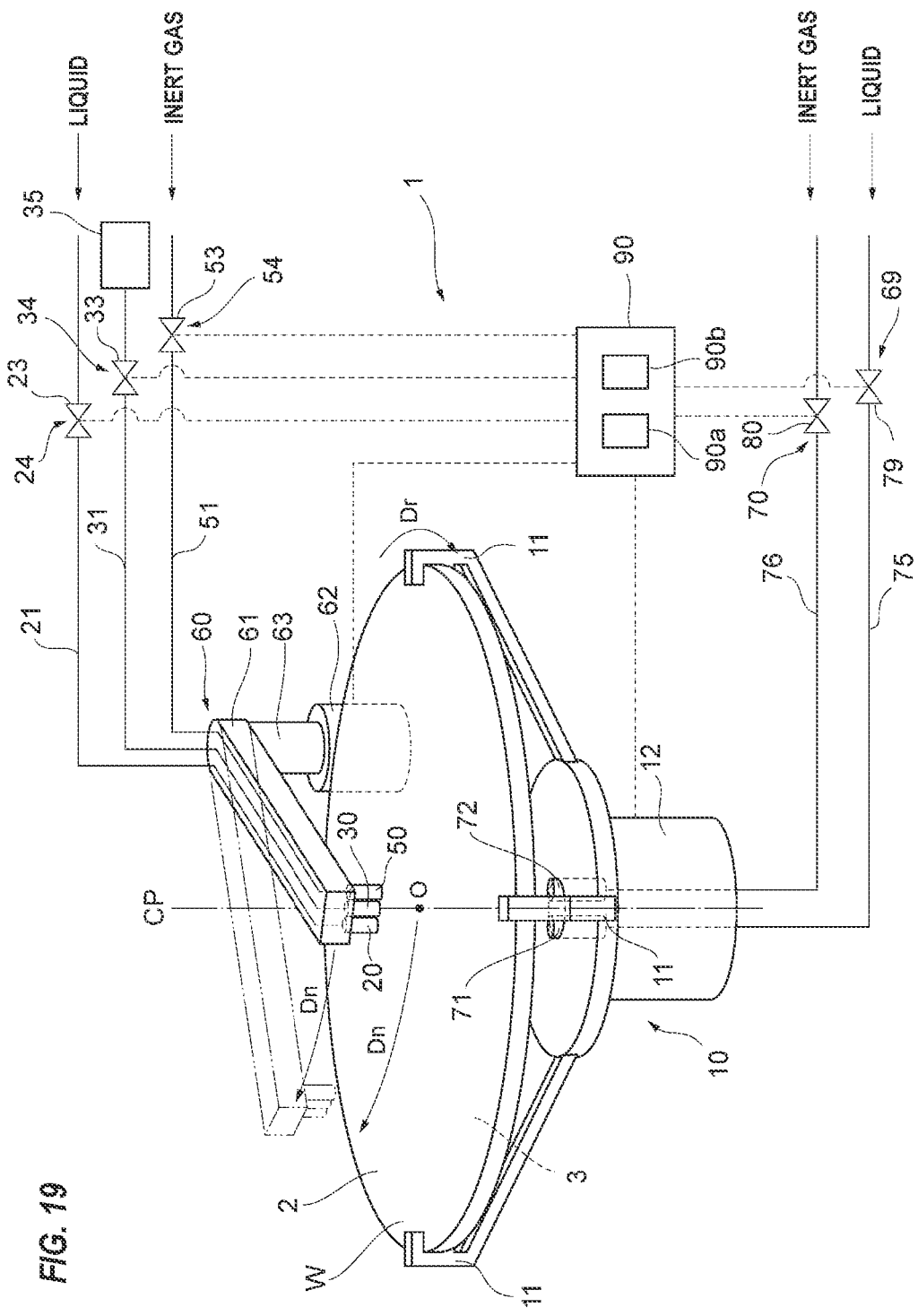
FIG. 19 is a perspective view schematically showing another embodiment of the substrate processing apparatus.

FIG. 19 is a schematic view of another embodiment of the substrate processing apparatus 1. Configurations of this embodiment, which is not specifically described, is the same as the embodiment described with reference to FIGS. 1, 2 and 5, so its redundant description is omitted. As shown in FIG. 19, the substrate processing apparatus 1 of this embodiment includes a dry fluid generator 35, and an end of the dry fluid supply line 31 is connected to the dry fluid generator 35. The dry fluid generator 35 is a device for vaporizing a liquid dry fluid (organic solvent). The gaseous dry fluid generated by the dry fluid generator 35 is supplied from the dry fluid generator 35 to the dry fluid supplied to the nozzle 30 through the dry fluid supply line 31. The configurations of FIGS. 3 and 4 can also be applied in this embodiment.

Figure 20:
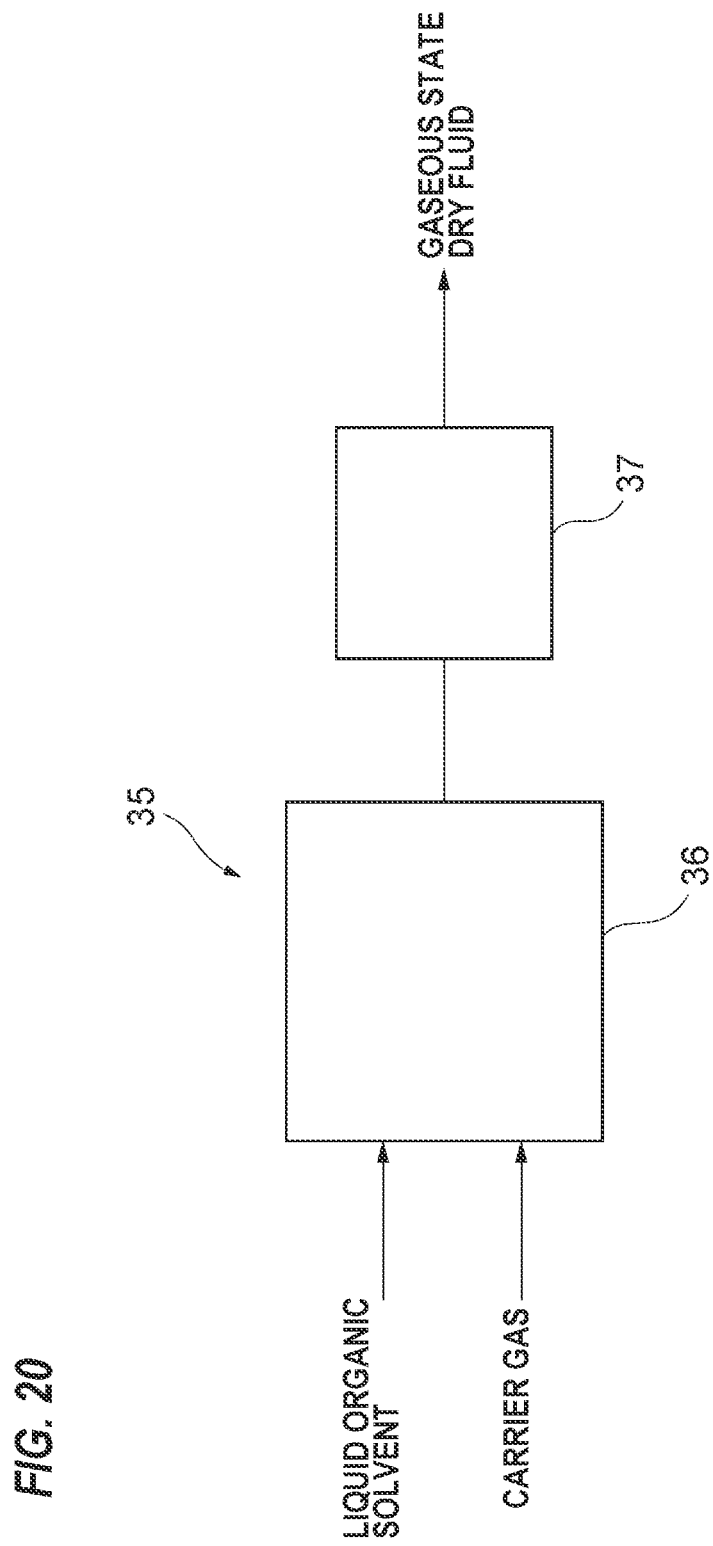
FIG. 20 is a schematic view showing a dry fluid generator.

FIG. 20 is a schematic view showing the dry fluid generator 35. The dry fluid generator 35 includes a gas-liquid mixing section 36 for mixing liquid dry fluid (organic solvent) and carrier gas, and a heater 37 for heating the mixed fluid of the dry fluid and carrier gas discharged from the gas-liquid mixing section 36. A mixed fluid of organic solvent and carrier gas is generated when the liquid organic solvent and carrier gas flow into the gas-liquid mixing section 36. The dry fluid generator 35 generates gaseous organic solvent by heating the above mixed fluid with the heater 37. Helium is used as an example carrier gas.

The drying fluid generator 35 outputs a gas (gaseous drying fluid) containing a relatively high concentration of gaseous organic solvent. In one embodiment, the content (concentration) of the organic solvent in the drying fluid is 8% to 30%. In this manner, the drying fluid is a gas containing a relatively high concentration of gaseous organic solvent to promote evaporation of the liquid on the surface 2. In this embodiment, the ventilation mechanism 8 and exhaust duct 9 also form air down flow. Therefore, the evaporated liquid can be actively removed from the substrate W, leading to further evaporation promotion, and even if the drying fluid contains relatively high concentrations of organic solvents, explosions can be prevented.

In one embodiment, the substrate processing apparatus 1 may include a heating device for heating the dry fluid supply line 31. Since heated dry fluid is output from the dry fluid generator 35, heating the dry fluid supply line 31 can be prevented from condensation.

Figure 21:
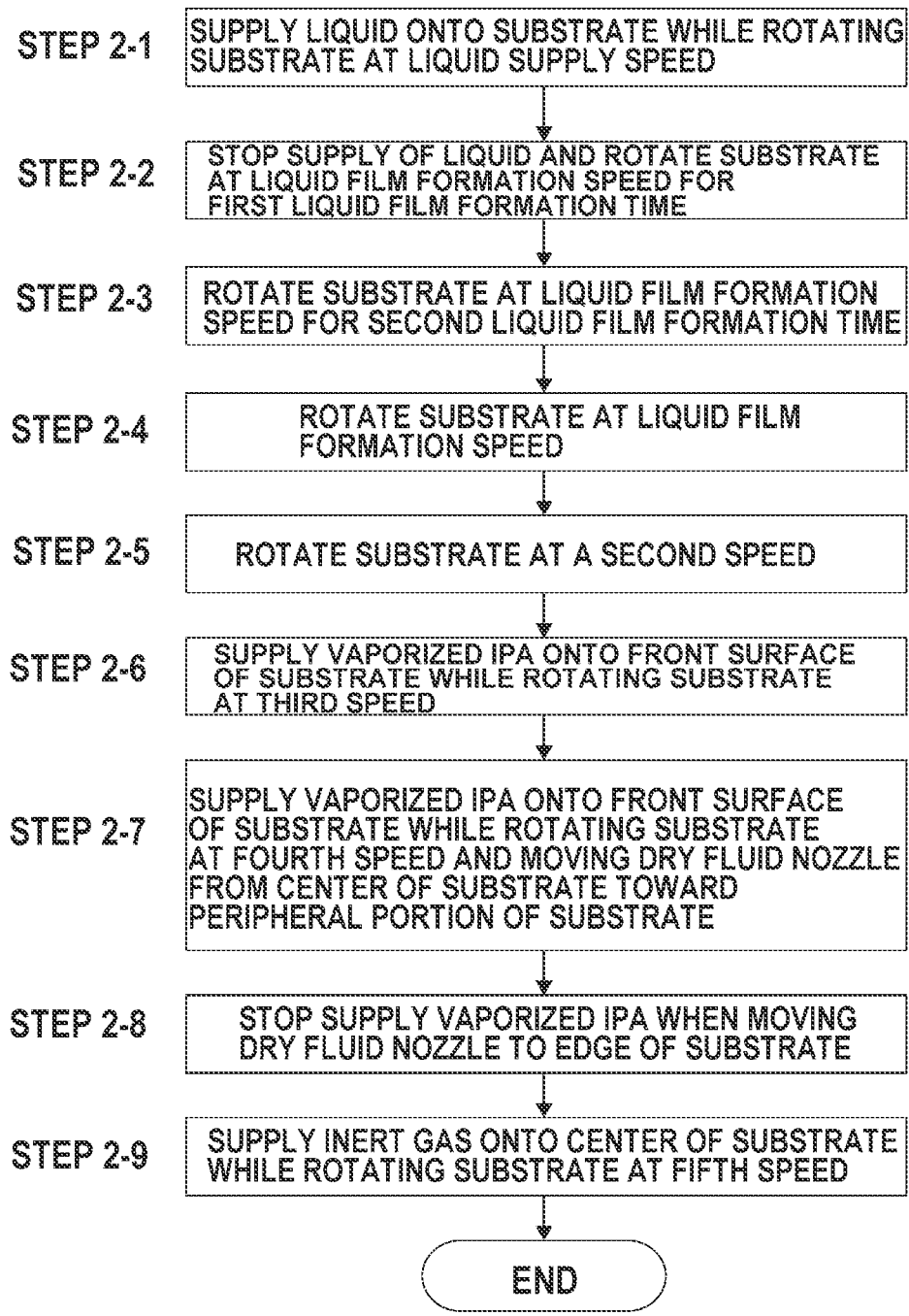
FIG. 21 is a flowchart showing another embodiment of the method of processing the substrate W.

Next, other processing methods for substrate W will be described. FIG. 21 is a flowchart showing other embodiments of the method of processing the substrate W. The dry fluid of the embodiment is a gas containing a high concentration of gaseous IPA (vaporized IPA) generated by the dry fluid generator 35 etc. The dry fluid used in the processing method of this embodiment described below is simply called vaporized IPA. In one embodiment of the processing method described below, the substrate processing apparatus 1 described with reference to FIGS. 19 and 20 is used unless otherwise specified.

In one embodiment, the dry fluid may be a gas containing a high concentration of a gaseous organic solvent other than the IPA (e.g., a fluorinated solvent containing alcohol). The gaseous organic solvent used as the dry fluid has the property of being miscible with water and evaporating faster than water.

Steps 2-1 through 2-4 are the same as the process (steps 1-1 through 1-4) described with reference to FIGS. 7 through 10, so their redundant explanations are omitted.

Figure 22:
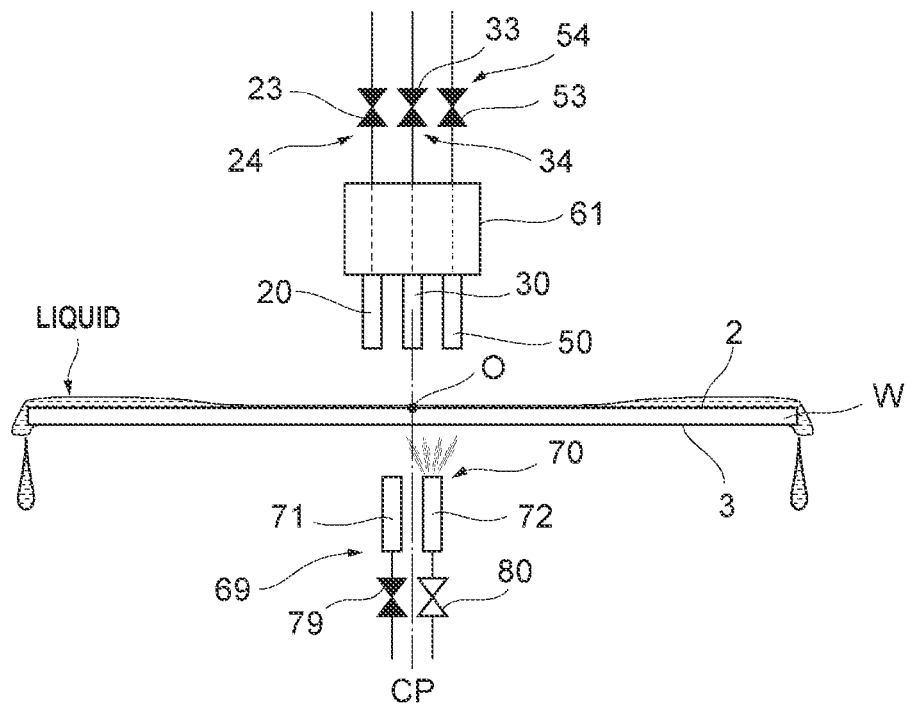
FIG. 22 is a view showing a state of the substrate processing apparatus.

Details of step 2-5, which are not specifically described, are the same as step 1-5, so redundant description thereof will be omitted. In one embodiment, the second speed in step 2-5 is 300 min$^{-1}$, the swing-out time is 3.1 seconds, and the inert gas supply rate in step 2-5 is 2 L/min. In step 2-5, as shown in FIG. 22, by rotating the substrate W at the second speed, the liquid film on the front surface 2 of the substrate W is further thinned from the state after step 2-4. More specifically, the circular thin film region in the center of the front surface 2 of the substrate W described in step 1-4 becomes even larger and thinner. In one embodiment, in step 2-5, by adjusting the second speed and/or the swing-out time, the liquid film on the front surface 2 of the substrate W is swung out, and the liquid film may be removed to expose the front surface 2. The exposure of the front surface 2 may be exposure of a portion of the front surface 2 (e.g., exposure of the center of the front surface 2) or exposure of the entire front surface 2.

Figure 23:
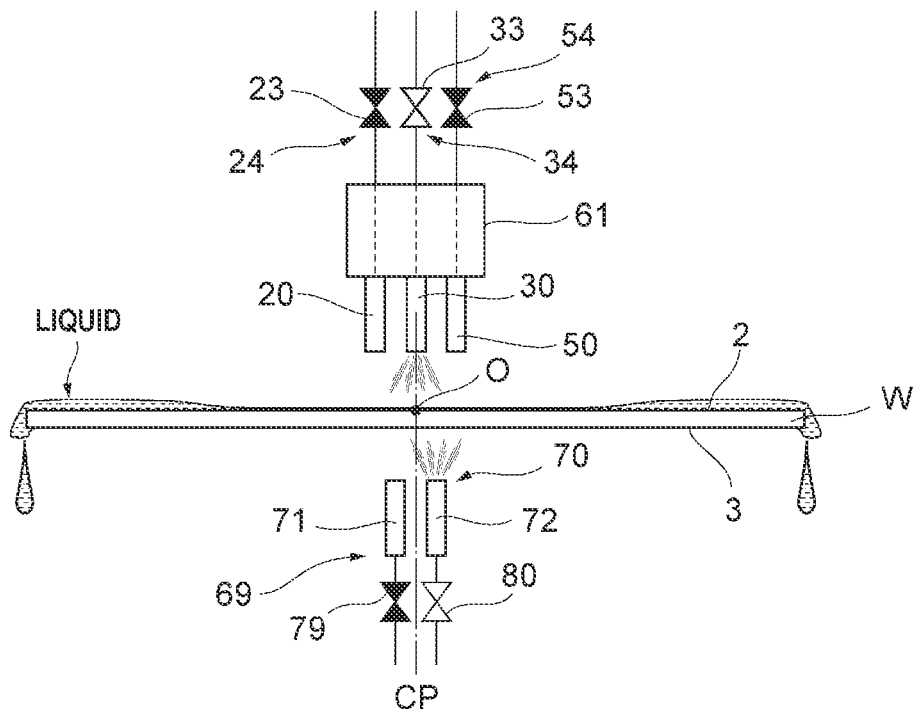
FIG. 23 is a view showing a state of the substrate processing apparatus.

Details of step 2-6, which are not specifically described, are the same as step 1-6, so redundant description thereof will be omitted. In step 2-6, as shown in FIG. 23, the controller 90 issues a command to the dry fluid flow rate control valve 33 while rotating the substrate W at the third speed to supply the vaporized IPA form the dry fluid nozzle 30 positioned above the center of the substrate W onto the front surface 2 of the substrate W for the dry fluid supply time. Specifically, in step 2-6, as shown in FIG. 23, the substrate processing apparatus 1 supplies the vaporized IPA onto the thin film formed in step 2-5. When the liquid film is removed in step 2-5, the substrate processing apparatus 1 supplies the vaporized IPA onto the front surface 2 of the substrate W from which the liquid film has been removed.

In one embodiment, the third speed in step 2-6 is 300 $min^{-1}$, the flow rate of the vaporized IPA supplied in step 2-6 is 5 g/min, and the dry fluid supply time is 3 seconds. The inert gas supply flow rate in step 2-6 is 2 L/min. In one embodiment, the third speed in step 2-6 may be increased from 100 $min^{-1}$ to 300 $min^{-1}$ (rotational acceleration 100 rpm/s). Specifically, the vaporized IPA is supplied onto the front surface 2 of the substrate W while accelerating the third speed from 100 $min^{-1}$ to 300 $min^{-1}$ at a rotational acceleration of 100 rpm/s, and in a state in which the dry fluid nozzle 30 remains stationary above the center of the substrate W for 2 seconds. After supplying the vaporized IPA to the front surface 2 of the substrate W for 2 seconds, the vaporized IPA is supplied to the front surface 2 of the substrate W for 1 second while the third speed is fixed at 300 $min^{-1}$. That is, even when the third speed is increased from 100 $min^{-1}$ to 300 $min^{-1}$, the dry fluid supply time is 3 seconds.

In step 2-6, the dry fluid (vaporized IPA) is supplied onto the formed film (or onto the front surface 2 from which the liquid film has been removed). As a result, the liquid remaining (adsorbed) on the substrate W in step 2-5 is mixed with the vaporized IPA, and evaporated together with the vaporized IPA. Also, by supplying the vaporized IPA onto the formed film (or onto the front surface 2 from which the liquid film has been removed), the amount of the dry fluid required for liquid evaporation can be reduced.

The process of step 2-7, which is not specifically described, is the same as step 1-7, so redundant description thereof will be omitted. Step 2-7 is different from step 1-7 in that the inert gas is not supplied from the inert gas nozzle 50 onto the front surface 2 of the substrate W. That is, the substrate processing apparatus 1 supplies only the vaporized IPA onto the front surface 2 of the substrate while moving the nozzles 20, 30 and 50 from the center of the substrate W toward the peripheral portion of the substrate W. When using the embodiment shown in FIG. 4, the inert gas nozzle holding arm 61c is positioned at the retracted position (outside the substrate holder 10), and the substrate processing apparatus 1 supplies the vaporized IPA onto the front surface 2 of the substrate W while moving the dry fluid nozzle 30 from the center of the substrate W toward the peripheral portion of the substrate W.

Also in the present embodiment, as described in step 1-7, the substrate processing apparatus 1 may move the dry fluid nozzle 30 to the center of the substrate W again after moving the dry fluid nozzle 30 onto the peripheral portion (above the peripheral portion) of the substrate. The substrate processing apparatus 1 may reciprocate the dry fluid nozzle 30 between the center and the peripheral portion of the substrate W. In one embodiment, as described in step 1-7, when the dry fluid nozzle 30 is positioned above the peripheral portion of the substrate W, the substrate processing apparatus 1 may stop the movement of the dry fluid nozzle 30 (when the dry fluid nozzle 30 is positioned above the peripheral portion of the substrate W, the movement of the drying fluid nozzle 30 is stopped, and the vaporized IPA is supplied to the peripheral portion of the substrate W for the peripheral portion dry time) to dry the peripheral portion of the substrate W for a predetermined time (peripheral portion dry time).

In one embodiment, processes similar to step 1-7 may be performed. That is, in one embodiment, the substrate processing apparatus 1 supplies each of the vaporized IPA and the inert gas from each of the dry fluid nozzle 30 and the inert gas nozzle 50 onto the front surface 2 of the substrate W while moving the nozzles 20, 30 and 50 (when using the embodiment shown in FIG. 4, the nozzles 30 and 50) from the center of the substrate W toward the peripheral portion of the substrate W.

In one embodiment, the supply of the inert gas from the inert gas nozzle 50 may be started simultaneously with the start of movement of the nozzles 20, 30 and 50 (or the nozzles 30 and 50). The supply of the inert gas from the inert gas nozzle 50 may be started when moving the inert gas nozzle 50 above the center O (e.g., on the axis CP).

In one embodiment, the fourth speed in step 2-7 may be increased from 300 $min^{-1}$ to 1800 $min^{-1}$ (50 rpm/s rotational acceleration) during step 2-7. Furthermore, in one embodiment, the time for performing step 2-7 (dry time) is 30 seconds, the supply flow rate of the vaporized IPA supplied in step 2-6 is 5 g/min, and the supply flow rate of the inert gas from the second back-surface nozzle 72 is 50 L/min.

The process of step 2-8, which is not specifically described, is the same as step 1-8, so redundant description thereof will be omitted. When a process similar to step 1-7 is performed in step 2-7, a process similar to step 1-9 is also performed. In one embodiment, when the dry fluid nozzle 30 has moved to the edge of the substrate W, the controller 90 may issue a command to the swivel motor 62 to stop the movements of the nozzles 20, 30 and 50. The controller 90 may issue a command to the inert gas flow rate control valve 53 to supply the inert gas onto the peripheral portion of the substrate W. In a state of using the embodiment shown in FIG. 4, when the dry fluid nozzle 30 has moved to the edge of the substrate W, the controller 90 issues a command to the swivel motor 62c while continually moving the dry fluid nozzle 30 to move the inert gas nozzle 50 above the peripheral portion of the substrate W. After moving the inert gas nozzle 50 above the peripheral portion of the substrate W, the controller 90 issues a command to the inert gas flow control valve 53 to supply the inert gas to the peripheral portion of the substrate W.

In this embodiment, nitrogen is also used as the inert gas supplied from the inert gas nozzle 50. In one embodiment, the rotational speed (fourth speed) of the substrate W when the inert gas is supplied from the inert gas nozzle 50 onto the peripheral portion of the substrate W is 1800 $min^{-1}$. The inert gas supply time from the inert gas nozzle 50 is 1 second, the inert gas supply flow rate from the inert gas nozzle 50 is 100 L/min, and the inert gas supply flow rate from the second back-surface nozzle 72 is 50 L/min.

If any liquid remains on the front surface 2, the liquid evaporates with the vaporizing IPA. By steps 2-6 through 2-8, the vaporized IPA can be supplied to the entire front surface 2 of the substrate W. Therefore, the liquid can be removed without any residual moisture, even adsorbed moisture on the substrate W. As a result, the substrate can be dried without residual liquid on the front surface 2 of the substrate W.

Step 2-9, which is not specifically described, is the same as step 1-10, so its redundant description is omitted. In one embodiment, the fifth speed is 1800 min$^{-1}$, and the flow rate of the inert gas supplied from the inert gas nozzle 50 in step 2-8 is 100 L/min, the flow rate of the inert gas supplied from the second back-surface side nozzle 72 is 50 L/min, and the finish dry time is 5 seconds.

Each of the above-described methods of processing the substrate W once the liquid film is formed on the entire surface of the substrate W (the entire front surface 2 of the substrate W), and then the substrate W is rotated at the second speed to supply the dry fluid onto the substrate after thinning the center of the liquid film on the substrate W or removing the liquid film. As a result, the liquid can be removed without residual even adsorbed moisture on the substrate. Therefore, each of the above-described methods for processing the substrate W can dry the substrate by suppressing residual adsorbed moisture on the substrate W. As a result, a removal rate of residual adsorbed moisture on the substrate W can be improved.

The surface properties of the substrate subjected to the dry processing are becoming more diverse, as there is a growing need to have both hydrophobic and hydrophilic regions on the same surface of the substrate, or to use the same semiconductor manufacturing apparatus for a variety of processes. Therefore, there is a new concern that wthen a variety of substrates are continuously dried using conventional substrate dry apparatus, the drying quality (percentage of moisture used for rinsing removed) will vary for each of the multiple substrates. In other words, in conventional substrate dry methods, a certain amount of moisture is removed from the substrate in advance, and the moisture that is not removed beforehand is attempted to be removed with dry gas. Therefore, the rate of its removal for each individual substrate varied, and efficient removal is not possible. Each of the above processing methods focuses on the fact that the moisture distribution on the surface of individual substrates differs from one substrate to another even if a certain amount of moisture has been removed. Once a film of liquid is formed on the entire surface of the substrate W, the above variation in moisture distribution on each individual substrate can be eliminated. Furthermore, by increasing the number of rotations (swing out speed) for removing the liquid film, variations in the thinning of the center of the liquid film and removal of the liquid film can be suppressed for each individual substrate. Furthermore, by supplying the dry fluid after rotating the substrate W at the swing out speed, the variation in the rate of water removal can be suppressed for each individual substrate.

The program for causing the controller 90 to perform each of the steps described above is recorded on a computer-readable storage medium, which is a non-transitory tangible object, and is provided to the controller 90 via the storage medium. The program is provided to the controller 90 via the storage medium. Alternatively, the program may be input to the controller 90 via a communication network such as the Internet or a local area network. The storage medium is used in the substrate processing apparatus 1 that processes the substrate W and records a program that operates on the computer.

When the surface of the substrate to be processed has a concavo-convex pattern, the convex part of the concavo-convex pattern may collapse due to the surface tension acting between the liquid and the convex side of the above concavo-convex pattern when the substrate is rotated at a high speed to swing out the liquid film formed on the substrate surface. This phenomenon is especially likely to occur in the case of concavo-convex patterns with large aspect ratios. Therefore, when drying the substrate with an uneven pattern formed on its surface as described above, it is necessary to mix the dry fluid such as IPA with the liquid before swinging out the above liquid film on the surface of the substrate, and then allow the liquid to evaporate together with the drying. The liquid must be evaporated together with the dry fluid (i.e., the liquid must be replaced by the drying fluid) before the liquid film is swinging out.

As described above, the substrate W in this embodiment is a substrate that has been polished by a chemical mechanical polishing process (CMP) and has the front surface 2 that has been planarized. When the substrate processing apparatus 1 processes the substrate whose the surface has been planarized by such a chemical-mechanical polishing process and which has been submitted to process in a wet state, even if the substrate is rotated at high speed and the center of the liquid film on the substrate is thinned or removed by swinging out the liquid film, the convexity collapse described above does not occur. Therefore, after the liquid film is formed on the substrate after CMP, the center of the liquid film can be thinned or removed by swinging out the liquid film, and then the dry fluid can be supplied. As a result, even adsorbed moisture on the substrate can be removed without residual moisture while controlling the amount of dry fluid used.

Figure 24:
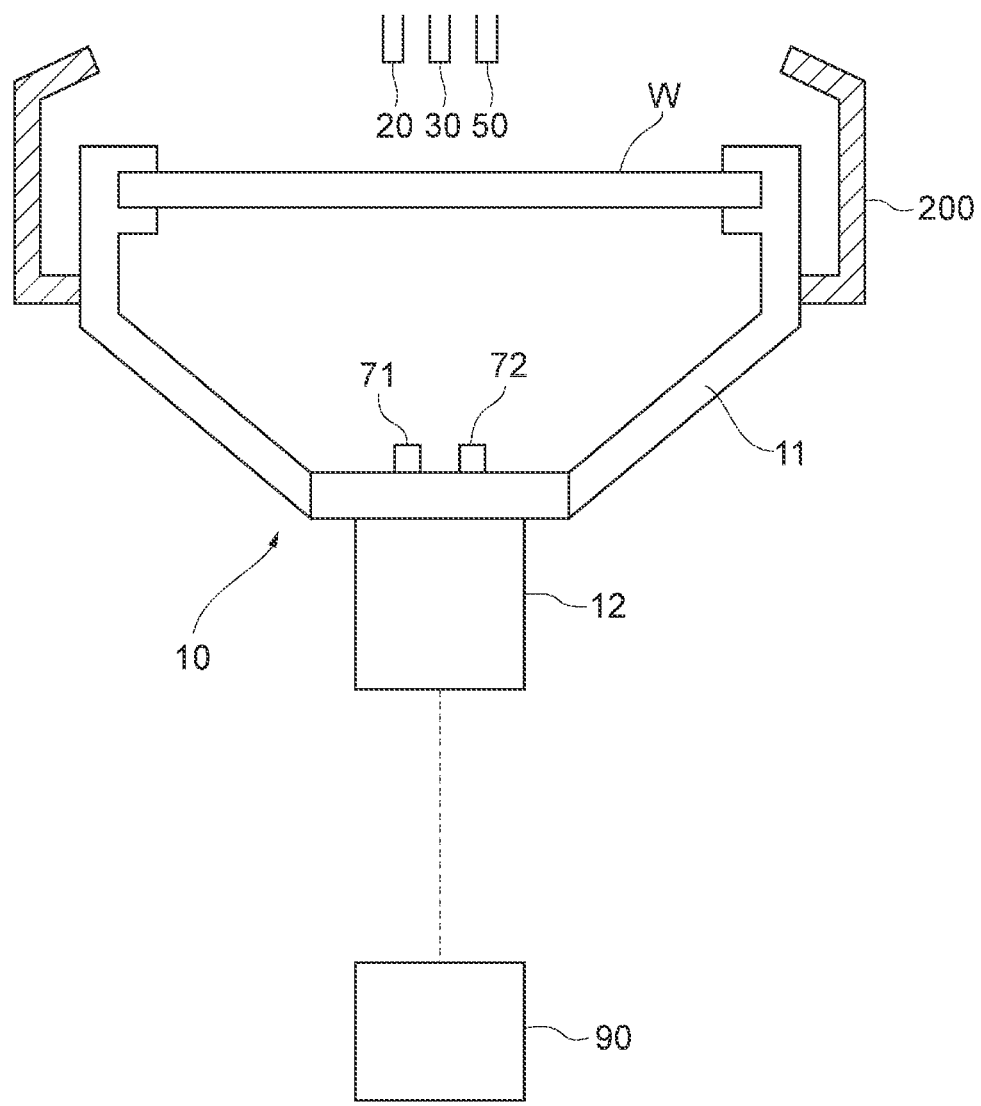
FIG. 24 is a view showing another embodiment of the substrate processing apparatus.

FIG. 24 is a view showing another embodiment of the substrate processing embodiment 1. In FIG. 24, some components of the substrate processing apparatus 1 are depicted. As shown in FIG. 24, the substrate processing apparatus 1 further includes a cover 200 arranged around the substrate W held by the substrate holder 10. The cover 200 has a cylindrical shape arranged concentrically with the substrate W, and is fixed to a plurality of chucks 11 of the substrate holder 10. The cover 200 receives the liquid scattered by centrifugal force from the rotating substrate W.

Figure 25:
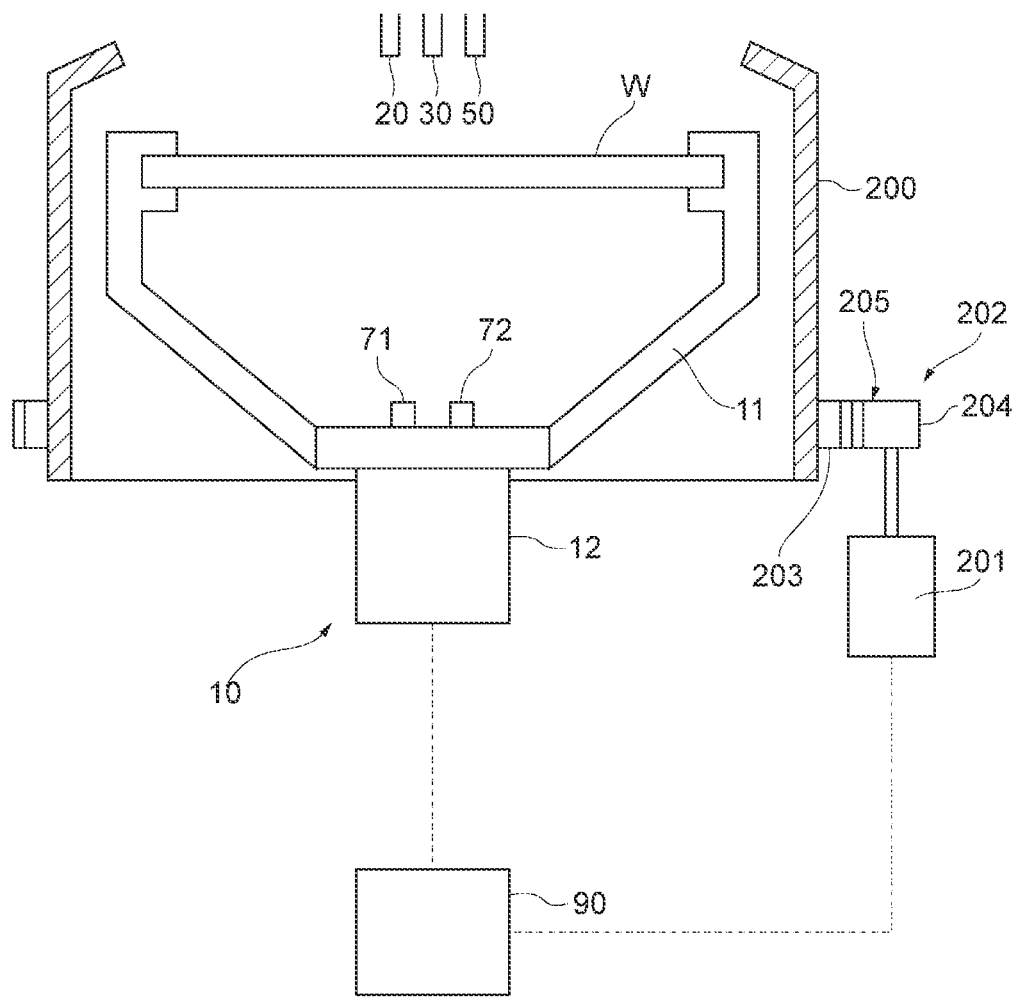
FIG. 25 is a view showing yet another embodiment of the substrate processing apparatus.

The cover 200 is arranged radially outward from the substrate W so as to surround the entire circumference of the substrate W. The controller 90 issues a command to the substrate holder 10. When the substrate W held by the chucks 11 rotates around the axis center CP of the substrate holder 10, the cover 20 fixed to the chucks 11 rotates in the same rotational direction and at the same rotational speed as the substrate W. In the embodiment shown in FIG. 24, the cover 200 rotates at the same rotational speed as the changing rotational speed of the substrate W. As a result, the cover 200 can reliably collect the liquid scattered from the rotating substrate W, preventing the liquid from bouncing back and adversely affecting the dry process. 101291 FIG. 25 is a view showing another embodiment of the substrate processing apparatus 1. In FIG. 25, some components of the substrate processing apparatus 1 are depicted. As shown in FIG. 25, the substrate processing apparatus 1 may include a cover rotation mechanism 202. In the embodiment shown in FIG. 25, the cover 200 is not fixed to the chuck 11 of the substrate holder 10, and is not fixed to the substrate holder 10.

As shown in FG. 25, the cover rotation mechanism 202 includes a cover motor 201, and a transmission device 205 that transmits the rotational force of the cover motor 201.

More specifically, the transmission device 205 includes a gear 204 fixed to the cover motor 201, and a tooth 203 attached to the outer circumference of the cover 200 and meshing with the gear 204. When the cover motor 201 rotates, the cover 200 is connected to the transmission device 205 (i.e., the tooth 203 and the gear 204).

The rotary motor 12 and the cover motor 201 are electrically connected to the controller 90. The controller 90 issues a command to the rotary motor 12 and the cover motor 201 so that the cover 200 rotates in the same rotational direction and at the same rotational speed as the substrate W. In this manner, the controller 90 rotates the cover 200 in synchronization with the rotation of the substrate W held by the substrate holder 10.

In the embodiment shown in FIG. 25, the transmission device 205 consists of the tooth 203 and the gear 204, but the configuration of the transmission device 205 is not limited to this embodiment. In one embodiment, not shown, the transmission device 205 may consist of a motor pulley fixed to the cover motor 201, a cover pulley attached to the outer circumference of the cover motor 200, and a belt that is crossed over the motor pulley and the cover pulley.

Figure 26:
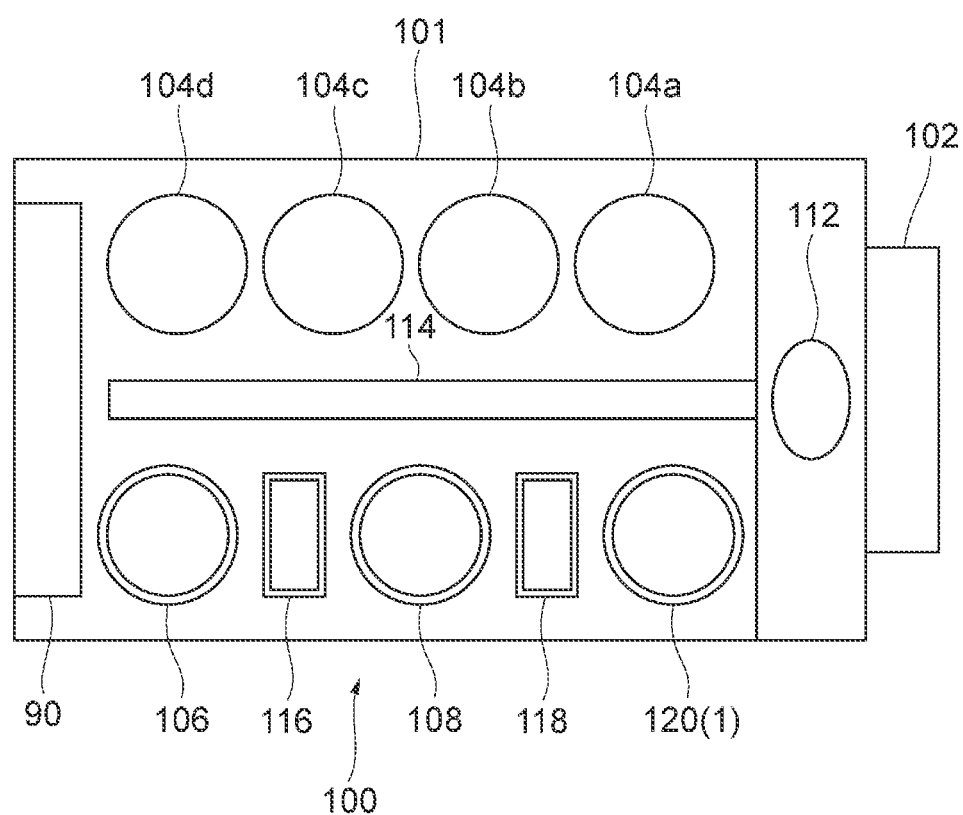
FIG. 26 is a schematic view showing a substrate processing system including the substrate processing apparatus.

FIG. 26 is a schematic view of the substrate processing system 100 including the substrate processing apparatus 1. As shown in FIG. 26, the substrate processing system 100 includes an abbreviated rectangular housing 101, and a load port 102 on which a substrate cassette containing a number of substrates is placed. The load port 102 is arranged adjacent to the housing 101. The load port 102 is equipped with an open cassette, a SMIF (Standard Manufacturing Interface) pods or a FOUP (Front Opening Unified Pods) can be loaded in load port 102. The SMIF and the FOUP contain the substrate cassette inside and are covered with a bulkhead. The SMIF and the FOUP are hermetically sealed containers that can maintain an environment independent of the external space by covering the interior with the bulkhead.

The housing 101 houses a plurality of polishing units 104*a* to 104*d* (four in this embodiment), a first cleaning unit 106 and a second cleaning unit 108 for cleaning the substrate after polishing, and a drying unit 120. The polishing units 104*a* to 104*d* are arranged along a longitudinal direction of the substrate processing system. The cleaning units 106, 108 and the drying unit 120 are also arranged along the longitudinal direction of the substrate processing system 100. The dry unit 120 includes the substrate processing apparatus 1 described above.

In the area surrounded by the load port 102, the polishing unit 104*a*, and the dry unit 120, the first substrate transfer robot 112 is located, and parallel to the polishing units 104*a* to 104*d*, a substrate transfer unit 114 is arranged. The first substrate transfer robot 112 receives the substrate before polishing from the load port 102, and passes it to the substrate transfer unit 114. The first substrate transfer robot 112 also receives the substrate after processing (after drying) from the dry unit 120 and returns it to the load port 102. The substrate transfer unit 114 transfers the substrate received from the first substrate transfer robot 112 to and from each of the polishing units 104*a* to 104*d*. Each of polishing units polishes the front surface of the substrate by sliding the substrate against the polishing surface while supplying the polishing liquid onto the polishing surface.

The second substrate transfer robot 116 that transfers the substrates between these cleaning units 106, 108 and the substrate transfer unit 114 is arranged between the first and second cleaning units 106, 108. A third substrate transfer robot 118, which transfers the substrates between these units 108, 120, is arranged between the second cleaning unit 108 and the substrate processing apparatus 1.

As the first cleaning unit 106, a substrate cleaning apparatus is used that cleans the substrate by rubbing a rolling sponge on both the front and back surfaces of the substrate in the presence of a chemical solution. As the second cleaning unit 108, a two-fluid type substrate cleaning device is used.

The substrate is polished by at least one of the polishing units 104*a* to 104*d*. The polished substrate is cleaned by the first cleaning unit 106 and the second cleaning unit 10, and the cleaned substrate is further processed by the substrate processing apparatus 1.

In one embodiment, the substrate processing system 100 may include three cleaning units, and may further include a defect inspection device (not shown) to detect defects (impurities and/or watermarks) in the substrate.

In the example shown in FIG. 26, the controller 90 is arranged inside the housing 101 outside the dry unit 120. In one embodiment, the controller 90 may be arranged inside the dry unit 120. By arranging the controller 90 inside the dry unit 120 (near the substrate processing apparatus 1), the load on the controller 90 can be reduced and communication delays can be suppressed.

In one further embodiment, the controller 90 may be arranged in the cleaning units 106 and 108, and may be arranged in the polishing units 104*a* to 104*d*. In one further embodiment, it may be arranged outside the housing 101 in a plant where the substrate processing system 100 is installed. In one further embodiment, the controller 90 comprises a plurality of computers, and the above computers may be dispersed throughout the plant.

In other words, at least one computer comprising the controller 90 may be arranged in the cleaning units 106, 108, near the cleaning units 106, 108, or in the substrate processing system 100 away from the cleaning units 106, 108. In one further embodiment, at least one computer comprising the controller 90 may be arranged on one line of a plurality of substrate processing systems in a semiconductor substrate manufacturing plant. In one further embodiment, a plurality of computers comprising the controller 90 may be arranged on a plurality of lines of a plurality of substrate processing systems. In one further embodiment, at least one computer comprising the controller 90 may be arranged in a line control and monitoring location or line control and monitoring system within a plant. In one further embodiment, the computer may be located within multiple factory monitoring locations or factory monitoring systems of a semiconductor substrate manufacturing company, or within a CMP apparatus manufacturing and installation company.

The above-described embodiments are described so that a person having ordinary knowledge in the technical field to which the invention pertains can practice the invention. For example, it can be applied to the processing of substrates that have undergone a grinding process, back grinding (or back polishing), or the dry process of the substrate that has undergone an application process with a coating device. Various modifications of the above embodiments can be made by those skilled in the art, and the technical idea of the present invention can be applied to other embodiments. Accordingly, the present invention is not limited to the described embodiments, but is to be construed in its broadest scope in accordance with the technical spirit defined by the claims.

INDUSTRIAL APPLICABILITY

The present invention is applicable to a substrate processing method and a substrate processing apparatus for processing a substrate. The invention is also available for a computer-readable storage medium containing a program for executing such a substrate processing method.

REFERENCE SIGNS LIST 1 substrate processing apparatus
2 front surface
3 back surface
6 partition wall
6a clean air intake port
7 processing chamber
8 ventilation mechanism
8A fan
8B filter
9 exhaust duct
10 substrate holder
11 chuck
12 rotary motor
20 liquid nozzle
21 liquid supply line
23 liquid flow rate control valve
24 liquid supply mechanism
30 dry fluid nozzle
31 dry fluid supply line
33 dry fluid flow rate control valve
34 dry fluid supply mechanism
35 dry fluid generator
36 gas-liquid mixing section
37 heater
50 inert gas nozzle
51 inert gas supply line
53 inert gas flow rate control valve
54 inert gas supply mechanism
60 nozzle movement mechanism
60a liquid nozzle movement mechanism
60b dry fluid nozzle movement mechanism
60c inert gas nozzle movement mechanism
61 arm
61a liquid nozzle holding arm
61b dry fluid nozzle holding arm
61c inert gas nozzle holding arm
62 swivel motor
62a, 62b. 62c swivel motor
63 swivel shaft
63a, 63b, 63c swivel shaft
65 heater
69 first back-surface side supply mechanism
70 second back-surface side supply mechanism
71 first back-surface nozzle
72 second back-surface nozzle
75 first back-surface side supply line
76 second back-surface side supply line
79 first back-surface side flow rate control valve
80 second back-surface side flow rate control valve
90 controller

The invention claimed is:

1. A substrate processing apparatus for processing a substrate, comprising:
   a substrate holder configured to hold and rotate the substrate;
   a liquid supply mechanism configured to supply a liquid from a liquid nozzle onto the substrate;
   a dry fluid supply mechanism configured to supply a dry fluid from a dry fluid nozzle onto the substrate;
   a nozzle movement mechanism configured to move the liquid nozzle and the dry fluid nozzle; and
   a controller configured to control operations of the substrate holder, the liquid supply mechanism, and the dry fluid supply mechanism,
   wherein the controller is configured to:
      issue a command to the substrate holder to rotate the substrate at a first speed;
      issue a command to the liquid supply mechanism to form a liquid film on an entire surface of the substrate by supplying the liquid from the liquid nozzle positioned above a center of the substrate onto the substrate for a predetermined time;
      issue a command to the liquid supply mechanism to stop a supply of the liquid;
      issue a command to the substrate holder, after rotating the substrate at the first speed, to rotate the substrate at a second speed;
      issue a command to the substrate holder, after rotating the substrate at the second speed, to rotate the substrate at a third speed, and issue a command to the dry fluid supply mechanism, while rotating the substrate at the third speed, to supply the dry fluid from the dry fluid nozzle positioned above the center of the substrate onto the substrate for a predetermined time; and
      issue a command to the nozzle movement mechanism while continuing to supply the dry fluid from the dry fluid nozzle to move the dry fluid nozzle from the center of the substrate toward a peripheral portion of the substrate,
   wherein the substrate processing apparatus further comprises an inert gas supply mechanism configured to supply an inert gas from an inert gas nozzle onto the substrate,
   wherein the controller is configured to issue a command to the inert gas supply mechanism in a state in which the dry fluid is supplied onto the substrate, and the substrate is rotating at a fourth speed to supply the inert gas from the inert gas nozzle onto the substrate, and
   wherein the controller is configured to issue a command to the nozzle movement mechanism to move the inert gas nozzle from the center of the substrate toward the peripheral portion of the substrate.

2. The substrate processing apparatus according to claim 1, wherein the second speed is faster than the first speed.

3. The substrate processing apparatus according to claim 1, wherein the controller is configured to issue a command to the nozzle movement mechanism, when the dry fluid nozzle is arranged above the peripheral portion of the substrate, to dry the peripheral portion of the substrate by stopping a movement of the dry fluid nozzle for a predetermined time.

4. The substrate processing apparatus according to claim 1, wherein the inert gas nozzle is arranged behind the dry fluid nozzle with respect to a direction of movement of the dry fluid nozzle and the inert gas nozzle.

5. The substrate processing apparatus according to claim 1, wherein the nozzle movement mechanism comprises one arm configured to hold the liquid nozzle, the dry fluid nozzle, and the inert gas nozzle.

6. The substrate processing apparatus according to claim 1, wherein the first speed comprises a liquid film formation speed for forming a liquid film on the substrate, and a thin film formation speed for thinning a center of the liquid film,
   wherein the controller is configured to issue a command to the substrate holder after rotating the substrate at the liquid film formation speed to rotate the substrate at the thin film formation speed, and wherein the thin film formation speed is faster than the liquid film formation speed.

7. The substrate processing apparatus according to claim 1, wherein the nozzle movement mechanism comprises a heater arranged adjacent to the dry fluid nozzle.

8. The substrate processing apparatus according to claim 1, wherein the dry fluid supply mechanism further comprises a conductive dry fluid supply line connected to the dry fluid nozzle.

9. The substrate processing apparatus according to claim 1, further comprising:
a ventilation mechanism arranged above the substrate holder; and
an exhaust duct,
wherein the ventilation mechanism and the exhaust duct are configured to form a down flow of air.

10. The substrate processing apparatus according to claim 1, wherein the dry fluid is a liquid organic solvent.

11. The substrate processing apparatus according to claim 1, wherein the dry fluid is a gas containing a gaseous organic solvent, and
wherein a content of the organic solvent in the dry fluid is 8% to 30%.

12. The substrate processing apparatus according to claim 1, wherein the substrate processing apparatus comprises a cover arranged around the substrate held by the substrate holder, and
wherein the cover is configured to rotate in the same direction and at the same speed as the substrate.

13. The substrate processing apparatus according to claim 12, wherein the substrate holder comprises a plurality of chucks configured to hold the peripheral portion of the substrate, and
wherein the cover is fixed to the chucks.

14. The substrate processing apparatus according to claim 12, comprising a cover rotation mechanism configured to rotate the cover,
wherein the cover rotation mechanism comprises:
a cover motor; and
a transmission device configured to transmit a rotational force of the cover motor to the cover.

15. A non-transitory computer-readable storage medium storing a program for use in a substrate processing apparatus for processing the substrate, the program operating on a computer, the program causes the computer to execute:
a step of issuing a command to a substrate holder to rotate the substrate at a first speed, the step of issuing a command to a liquid supply mechanism to form a liquid film onto an entire surface of the substrate by supplying a liquid from a liquid nozzle positioned above a center of the substrate onto the substrate for a predetermined time;
a step of issuing a command to the liquid supply mechanism to stop a supply of the liquid;
a step of issuing a command to the substrate holder to rotate the substrate at a second speed after rotating the substrate at the first speed;
a step of issuing a command to the substrate holder to rotate the substrate at a third speed after rotating the substrate at the second speed, the step of issuing a command to a dry fluid supply mechanism while rotating the substrate at the third speed to supply a dry fluid from a dry fluid nozzle onto the substrate for a predetermined time;
a step of issuing a command to a nozzle movement mechanism while continuing to supply the dry fluid from the dry fluid nozzle to move the dry fluid nozzle from the center of the substrate toward a peripheral portion of the substrate, and
wherein the program causes the computer to execute a step of issuing a command to the inert gas supply mechanism in a state in which the dry fluid is supplied onto the substrate, and the substrate is rotating at a fourth speed to supply the inert gas from the inert gas nozzle onto a front surface of the substrate.

16. A substrate processing method, comprising:
forming a liquid film onto an entire surface of a substrate by rotating the substrate at a first speed to supply a liquid from a liquid nozzle positioned above a center of the substrate onto the substrate for a predetermined time;
stopping a supply of the liquid;
rotating the substrate at a second speed after rotating the substrate at the first speed;
supplying a dry fluid from a dry fluid nozzle positioned above the center of the substrate onto the substrate for a predetermined time while rotating the substrate at a third speed after rotating the substrate at the second speed;
moving the dry fluid nozzle from the center of the substrate toward a peripheral portion of the substrate while continuing to supply the dry fluid from the dry fluid nozzle, and
comprising supplying an inert gas from an inert gas nozzle onto the substrate while moving the dry fluid nozzle and the inert gas nozzle from the center of the substrate toward the peripheral portion of the substrate.

17. The substrate processing method according to claim 16, wherein supplying the inert gas from the inert gas nozzle onto the substrate comprises injecting the inert gas behind the dry fluid injection position with respect to a direction of movement of the dry fluid nozzle and the inert gas nozzle.

* * * * *